(12) United States Patent
Park et al.

(10) Patent No.: US 8,822,971 B2
(45) Date of Patent: Sep. 2, 2014

(54) SEMICONDUCTOR MEMORY DEVICE HAVING THREE-DIMENSIONALLY ARRANGED RESISTIVE MEMORY CELLS

(75) Inventors: Jintaek Park, Hwaseong-si (KR); Youngwoo Park, Seoul (KR); Jungdal Choi, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 8 days.

(21) Appl. No.: 13/606,789

(22) Filed: Sep. 7, 2012

(65) Prior Publication Data

US 2013/0134377 A1    May 30, 2013

(30) Foreign Application Priority Data

Nov. 25, 2011    (KR) .................. 10-2011-0124204

(51) Int. Cl.
*H01L 29/02* (2006.01)
*H01L 47/00* (2006.01)
*H01L 29/04* (2006.01)
*H01L 29/06* (2006.01)
*H01L 21/02* (2006.01)
*H01L 29/82* (2006.01)
*H01L 21/20* (2006.01)

(52) U.S. Cl.
USPC ............ 257/4; 257/2; 257/3; 257/5; 257/295; 257/421; 438/3; 438/382

(58) Field of Classification Search
USPC ............................................. 257/4
See application file for complete search history.

(56) References Cited

U.S. PATENT DOCUMENTS

| 7,057,922 | B2 | 6/2006 | Fukumoto |
| 7,800,091 | B2 | 9/2010 | Kamigaichi et al. |
| 7,952,163 | B2 | 5/2011 | Baek et al. |
| 2005/0122768 | A1 | 6/2005 | Fukumoto |
| 2008/0067554 | A1 | 3/2008 | Jeong et al. |
| 2008/0265235 | A1* | 10/2008 | Kamigaichi et al. ............. 257/2 |
| 2009/0230512 | A1* | 9/2009 | Baek et al. ................... 257/536 |
| 2009/0267139 | A1 | 10/2009 | Maejima |
| 2010/0052042 | A1 | 3/2010 | Tanaka et al. |
| 2011/0317472 | A1* | 12/2011 | Awaya et al. ................ 365/148 |
| 2012/0248504 | A1* | 10/2012 | Liu .............................. 257/208 |

FOREIGN PATENT DOCUMENTS

| EP | 2136398 A1 | 12/2009 |
| JP | 2005092912 A | 4/2005 |
| JP | 2008258458 A | 10/2008 |
| JP | 2009266280 A | 11/2009 |
| KR | 100582923 B1 | 5/2006 |
| KR | 20080024971 A | 3/2008 |
| KR | 101126834 B1 | 4/2012 |
| WO | WO-2008126774 A1 | 10/2008 |

* cited by examiner

*Primary Examiner* — Shaun Campbell
*Assistant Examiner* — Thai T Vuong
(74) *Attorney, Agent, or Firm* — Harness, Dickey & Pierce, P.L.C.

(57) ABSTRACT

Semiconductor memory devices are provided. The device may include may include first and second selection lines connected to each other to constitute a selection line group, a plurality of word lines sequentially stacked on each of the first and second selection lines, vertical electrodes arranged in a row between the first and second selection lines, a plurality of bit line plugs arranged in a row at each of both sides of the selection line group, and bit lines crossing the word lines and connecting the bit line plugs with each other.

23 Claims, 42 Drawing Sheets

SEMICONDUCTOR MEMORY DEVICE HAVING THREE-DIMENSIONALLY ARRANGED RESISTIVE MEMORY CELLS

CROSS-REFERENCE TO RELATED APPLICATIONS

This U.S. non-provisional patent application claims priority under 35 U.S.C. §119 to Korean Patent Application No. 10-2011-0124204, filed on Nov. 25, 2011, in the Korean Intellectual Property Office, the entire contents of which are hereby incorporated by reference.

BACKGROUND

Example embodiments of inventive concepts relate to semiconductor memory devices, and more particularly, to semiconductor memory devices having three-dimensionally arranged resistive memory cells.

A three dimensional integrated circuit (3D-IC) memory technique may be used for increasing memory capacity. A 3D-IC memory technique refers generally to technologies related to arranging memory cells three-dimensionally. In addition to a 3D-IC memory technique, a memory capacity may be increased through (1) a pattern miniaturization technique, and (2) a multi-level cell (MLC) technique. However, the use of a pattern miniaturization technique may be limited due to high cost, and the capacity increase achieved by the MLC technique may be limited to the number of bits to be increased in each cell. The pattern miniaturization technique and the MLC techniques may be combined with the 3D-IC technique, in terms of realizing a more increased memory capacity, and may be expected to develop separately from the 3D-IC technique.

One 3D-IC technique is a punch-and-plug technique. The punch-and-plug technique includes sequentially forming multi-layered thin layers on a substrate and then forming plugs to penetrate the thin layers. Through this technique, without a drastic increase of manufacturing costs, a memory capacity of a three-dimensional memory device may be achieved.

SUMMARY

Example embodiments of inventive concepts relate to semiconductor memory devices having an increased integration density.

According to example embodiments of inventive concepts, a three-dimensional semiconductor device may include a substrate including first and second doped regions separated by a channel region, a bit line coupled to the first doped region, a vertical electrode coupled to the second doped region, a stack of horizontal electrodes between the substrate and the bit line, and a selection line between the stack and the substrate. The selection line may have a planar shape and a planar position that is substantially the same as a planar shape and a planar position of the horizontal electrodes.

A horizontal distance between the selection line and the vertical electrode may be substantially equivalent to a horizontal distance between the horizontal electrode and the vertical electrode.

The device may further include a bit line plug connecting the bit line with the first doped region. A horizontal distance between the selection line and the bit line plug may be substantially equivalent to a horizontal distance between the horizontal electrode and the bit line plug.

The bit line may cross the horizontal electrodes, the selection line and the stack may cross the channel region.

The first and second doped regions may be different from each other in terms of a horizontal width overlapping with the selection line. The selection line may overlap a first portion of the first doped region. The selection line may overlap a first part of the second doped region. A width of the first portion of the first doped region may be different than a width of the first part of the second doped region.

A material of selection line may be substantially the same as a material of the horizontal electrodes.

The stack may further include mold layers between the horizontal electrodes in a vertical direction, and a space between the mold layer and the vertical electrode may be greater than a space between the horizontal electrodes and the vertical electrode.

The device may further include memory patterns between the horizontal electrodes and the vertical electrode. A first horizontal thickness of the memory pattern at a level of at least one of the horizontal electrodes may be smaller than a second horizontal thickness of the memory pattern at a level of the mold layer.

The stack may further include mold layers between the horizontal electrodes in a vertical direction, and a rectifying element between the horizontal electrodes and the vertical electrode. A space between the mold layer and the vertical electrode may be different from a space between the rectifying element and the vertical electrode.

The device may further include memory patterns between the horizontal electrodes and the vertical electrode. The memory pattern may include at least one of chalcogenides, a layered structures configured to exhibit a magnetoresistance property, perovskite compounds, and transition metal oxides.

According to example embodiments of inventive concepts, a three-dimensional semiconductor device may include a selection line group including first and second selection lines connected to each other, a plurality of word lines sequentially stacked on each of the first and second selection lines, vertical electrodes arranged in a row between the first and second selection lines, a plurality of bit line plugs arranged in a row at each of both sides of the selection line group, and bit lines crossing the word lines and connecting the bit line plugs with each other.

The word lines may be electrically separated from each other and may thereby be configured to have different voltages from each other.

The word lines may delimit first and second trenches. The vertical electrodes may be in the first trench. The bit line plugs may be in the second trench. Each of the second trenches may have a length that is sufficient to cross a plurality of the bit lines.

The first trench may have a length that is sufficient to cross a plurality of the bit lines.

In example embodiments, each of the first and second selection lines may have a planar shape and a planar position that is substantially the same as a planar shape and a planar position of the plurality of word lines on the first and second selection lines.

Horizontal distances between the first and second selection lines and the vertical electrode may be substantially equivalent to horizontal distances between the plurality of word lines and the vertical electrode.

Horizontal distances between the first and second selection lines and the bit line plug may be substantially equivalent to those between the word lines and the bit line plug.

The device may further include a plurality of active patterns below the selection line group. Each of the active patterns may include a pair of drain regions spaced apart from each other, a source region between the drain regions, and a pair of channel regions between the drain regions and the source region. The vertical electrodes may be coupled to the source regions. The bit line plugs may be coupled to the drain regions, and the first and second selection lines may be face the pair of channel regions.

A width of each one of the drain regions may overlap with one of the first and second selection lines. The width of each one of the drain regions that overlaps with one of the first and second lines may be different from at least one of a first width of the source region that overlaps with the first selection line and a second width of the source region that overlaps with the second selection line.

A material of the first and second selection lines may be substantially the same as material of the plurality of word lines.

The device may further include mold layers between the word lines in a vertical direction, and a space between the mold layers and the vertical electrode may be greater than a space between at least one of the plurality of word lines and the vertical electrode.

The device may further include memory patterns between the word lines and the vertical electrode. A first horizontal thickness of the memory pattern at a level of at least one of the plurality of word lines may be smaller than a second horizontal thickness of the memory pattern at a level of at least one of the mold layers.

The device may further include memory patterns between the word lines and the vertical electrode. The memory pattern may include at least one of chalcogenides, layered structures configured to exhibit a magnetoresistance property, perovskite compounds, and transition metal oxides.

According to example embodiments of inventive concepts, a three-dimensional semiconductor device may include an electrode structure including a plurality of stacks on a substrate, a plurality of bit lines disposed on the electrode structure and crossing the stacks, vertical electrodes penetrating the electrode structure, and bit line plugs penetrating the electrode structure, each of the bit line plugs being connected to the corresponding one of the bit lines. Each of the stacks may include a selection line and a plurality of word lines sequentially stacked on the selection line. The word lines included in odd-numbered ones, at the same level, of the stacks may be connected to each other and the word lines included in even-numbered ones, at the same level, of the stacks may be connected to each other. The selection line in each odd-numbered stack may be connected to the selection line in the even-numbered stack positioned on the right side thereof, thereby constituting a selection line group. The vertical electrodes may be positioned within the selection line group and the bit line plugs may be positioned between the selection line groups.

According to example embodiments of inventive concepts, a three-dimensional semiconductor device includes: a selection transistor including a first doped region and a second doped region of a substrate that are separated along a first direction by a channel region of the substrate, a selection line that extends over the channel region in a second direction that intersects the first direction, the selection transistor being configured to control an electrical connection between a bit line coupled to the first doped region of the substrate and a vertical electrode on the second doped region of the substrate; and a plurality of word lines stacked on the selection transistor, the plurality of wordlines having a width along the first direction that is about equal to a width of the selection line along the first direction.

The selection transistor may further include a gate insulation layer between the channel region and the selection line.

The device may further include a memory pattern between the vertical electrode and at least one of the selection transistor and the plurality of wordlines. A distance along the first direction between the vertical electrode and the selection transistor is about equal to a distance along the first direction between the vertical electrode and at least one of the plurality of wordlines.

The device may include a memory pattern surrounding at least two surface of each of the plurality of wordlines and at least two surfaces of the selection line.

The device may include a plurality of isolation patterns on the substrate that define a plurality of active regions extending in the first direction and are spaced apart in the second direction, and a plurality of bitlines over the plurality of isolation patterns. Each active region may include a plurality of the first doped regions, channel regions, and second doped regions alternately arranged along the first direction. The device may further include a plurality of the vertical electrodes on the second doped regions respectively, a plurality of bitline plugs, and plurality of the selection transistors. Each one of the plurality of bitline plugs may connect one of the first doped regions to one of the plurality of bitlines. The plurality of selection transistors may each be configured to control electrical connections between one of the plurality of bitlines coupled to one of the first doped regions of the substrate and one of the plurality of vertical electrodes on the second doped region of the substrate.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 2A through 11A are perspective views illustrating a method of fabricating a 3D semiconductor device according to example embodiments of inventive concepts;

FIG. 2B through 11B are sectional views taken along lines I-I and II-II of FIGS. 2A through 11A, respectively;

Figure 1:
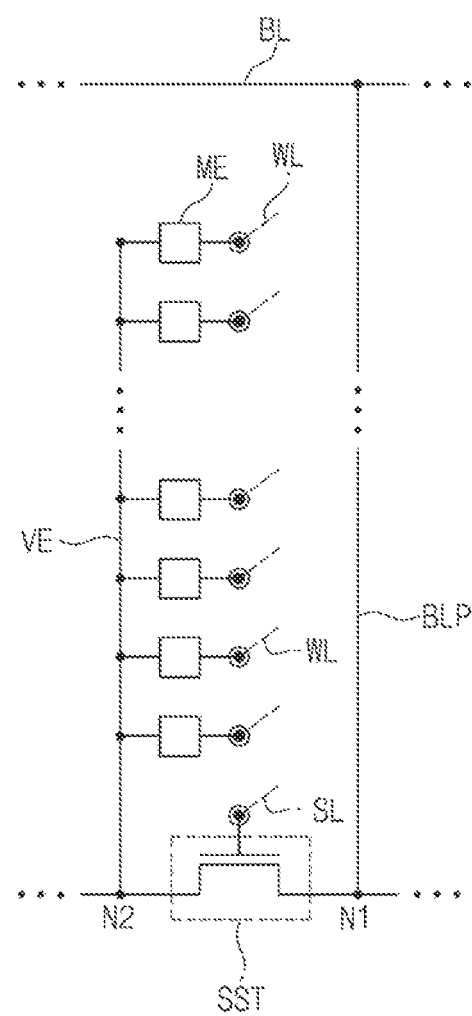
FIG. 1 is a circuit diagram illustrating a portion of a cell array region of a 3D semiconductor device according to example embodiments of inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of like reference numbers in the various drawings is intended to indicate the presence of a like element or feature.

DETAILED DESCRIPTION

Example embodiments of s inventive concepts will now be described more fully with reference to the accompanying drawings, in which some example embodiments are shown. Example embodiments of inventive concepts may, however, be embodied in many different forms and should not be construed as being limited to the embodiments set forth herein; rather, these example embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a circuit diagram illustrating a portion of a cell array region of a 3D semiconductor device according to example embodiments of inventive concepts.

Referring to FIG. 1, a selection transistor SST may be provided to connect a first node N1 with a second node N2. A bit line BL may be provided over on the selection transistor SST. The bit line BL may be connected to the first node N1 via a bit line plug BLP.

A plurality of word lines WL may be provided between the bit line BL and the selection transistor SST, and a vertical electrode VE may be connected to the second node N2. A plurality of memory elements ME may be connected in parallel to the vertical electrode VE. Each of the memory elements ME may be connected to the corresponding one of the word lines WL. In other words, each of the word lines WL may be connected in parallel to the vertical electrode VE via the corresponding one of the memory elements ME.

The selection transistor SST may include a selection line SL serving as a gate electrode thereof. In example embodiments, the selection line SL may be parallel to the word lines WL.

The 3D semiconductor device of FIG. 1 may be realized using fabrication methods according to example embodiments of inventive concepts.

FIGS. 2A through 11A are perspective views illustrating a method of fabricating a 3D semiconductor device according to example embodiments of inventive concepts, and FIG. 2B through 11B are sectional views taken along lines I-I and II-II of FIGS. 2A through 11A, respectively.

Figure 2A:
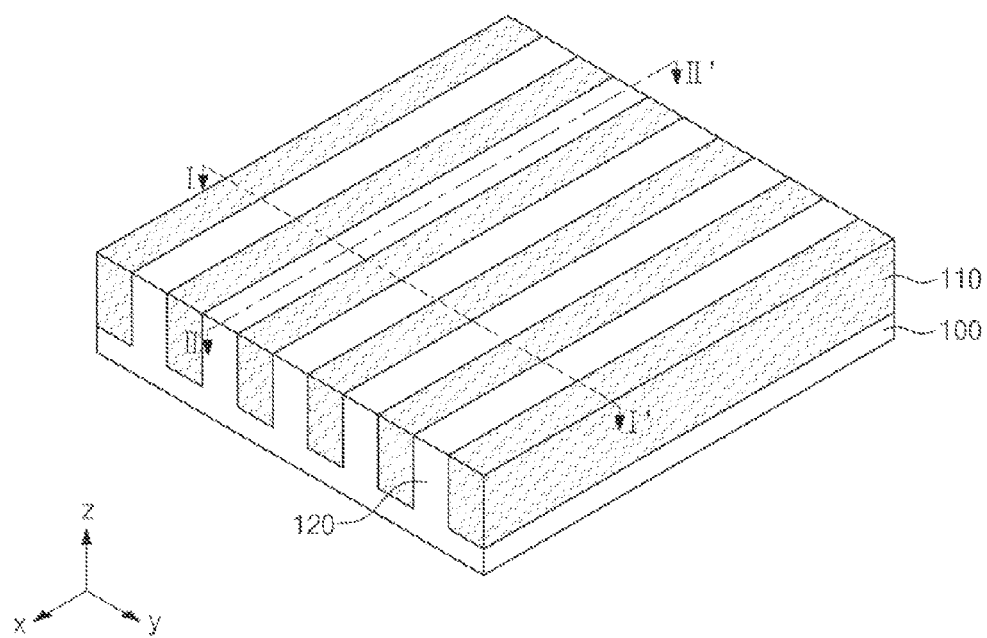
Figure 2B:
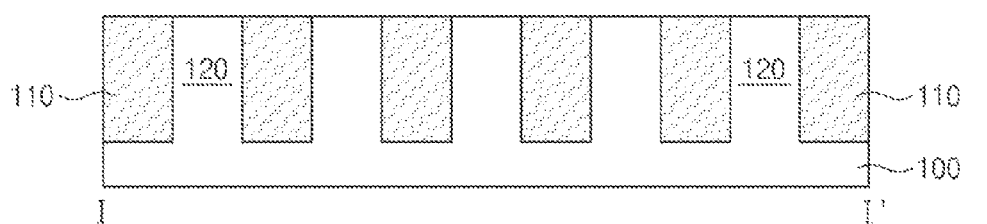
Figure 2B:
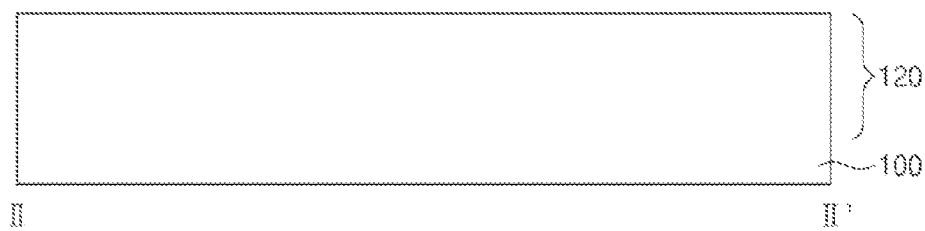

Referring to FIGS. 2A and 2B, a plurality of device isolation patterns 110 may be formed on a substrate 100 to delimit active regions 120. The substrate 100 may be formed to include at least one of semiconductors, insulators, conductors, and a combination thereof. The substrate 100 may be a silicon wafer or a silicon-layer containing substrate, but example embodiments of inventive concepts are not limited thereto.

Each of the device isolation patterns 110 may be a line-shaped pattern, whose longitudinal axis is parallel to a specific direction (for example, x direction). In addition, the device isolation patterns 110 may be parallel to each other. Accordingly, the active regions 120 may also be parallel to each other and each of them may be a line-shaped pattern. The device isolation patterns may be formed of at least one dielectric material, such as silicon oxide, but example embodiments are not limited thereto.

Figure 3A:
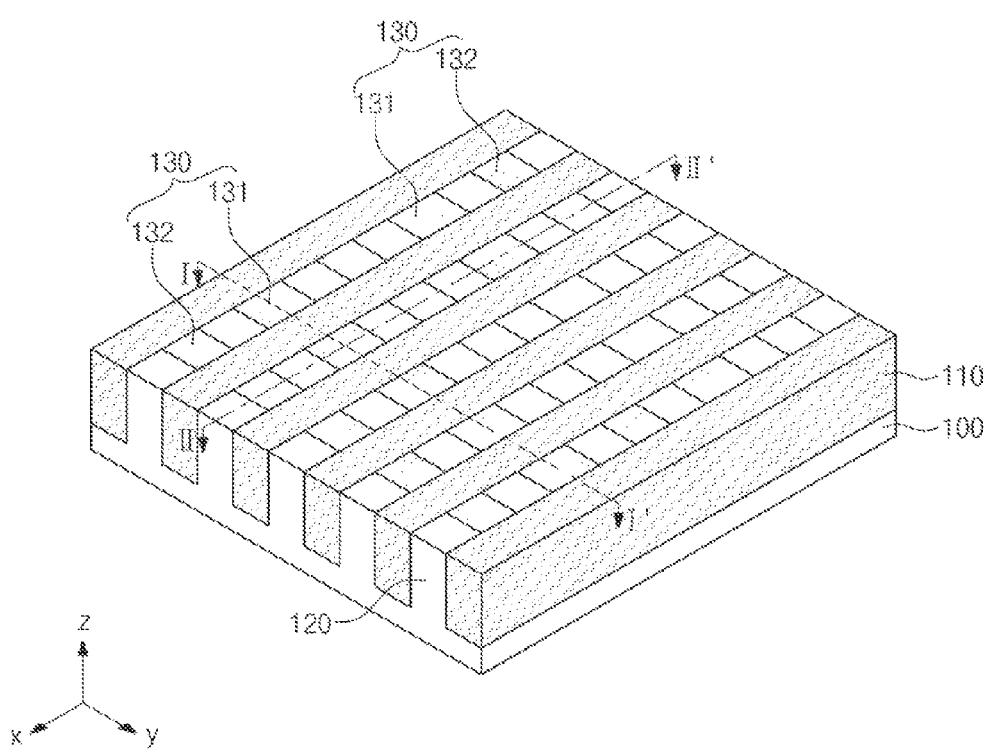
Figure 3B:
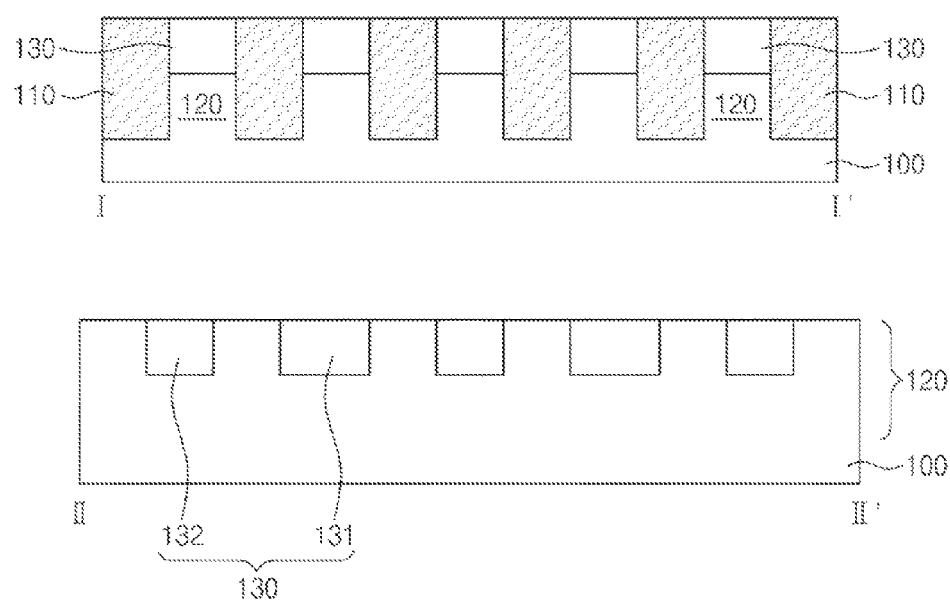

Referring to FIGS. 3A and 3B, doped regions 130 may be formed in upper portions of the active regions 120. The doped regions 130 may be two-dimensionally arranged on the substrate 100. For example, several ones of the doped regions 130 may be formed spaced apart from each other along the longitudinal axis of the device isolation pattern 110, in every one of the active regions 120. The doped regions 130 may include second doped regions 132, each of which serves as the first node N1 described with reference to FIG. 1, and first doped regions 131, each of which serves as the second node N2. The first and second doped regions 131 and 132 may be alternately arranged along the longitudinal axis of the device isolation pattern 110. The first 131 and second doped regions 132 may contain an n-type or p-type impurity implanted into therein, such as boron, aluminum, phosphorus, and/or arsenic, but example embodiments are not limited thereto.

The formation of the doped regions 130 may include forming a mask pattern (not shown) on the device isolation patterns 110 to cross the active regions 130 and then performing an ion implantation process using the mask pattern as an ion mask.

In example embodiments, the doped regions 130 may be formed before the formation of the device isolation patterns 110. In addition, at least one ion implantation process may be additionally performed to inject impurities into the active region 120 or the substrate 100. For example, impurities may be injected into the active region 120 to adjust a threshold voltage of the selection transistor SST, or an ion implantation process may be performed to form a well region in the substrate 100. These additional ion implantation processes may be performed before or after the formation of the device isolation patterns 110.

Figure 4A:
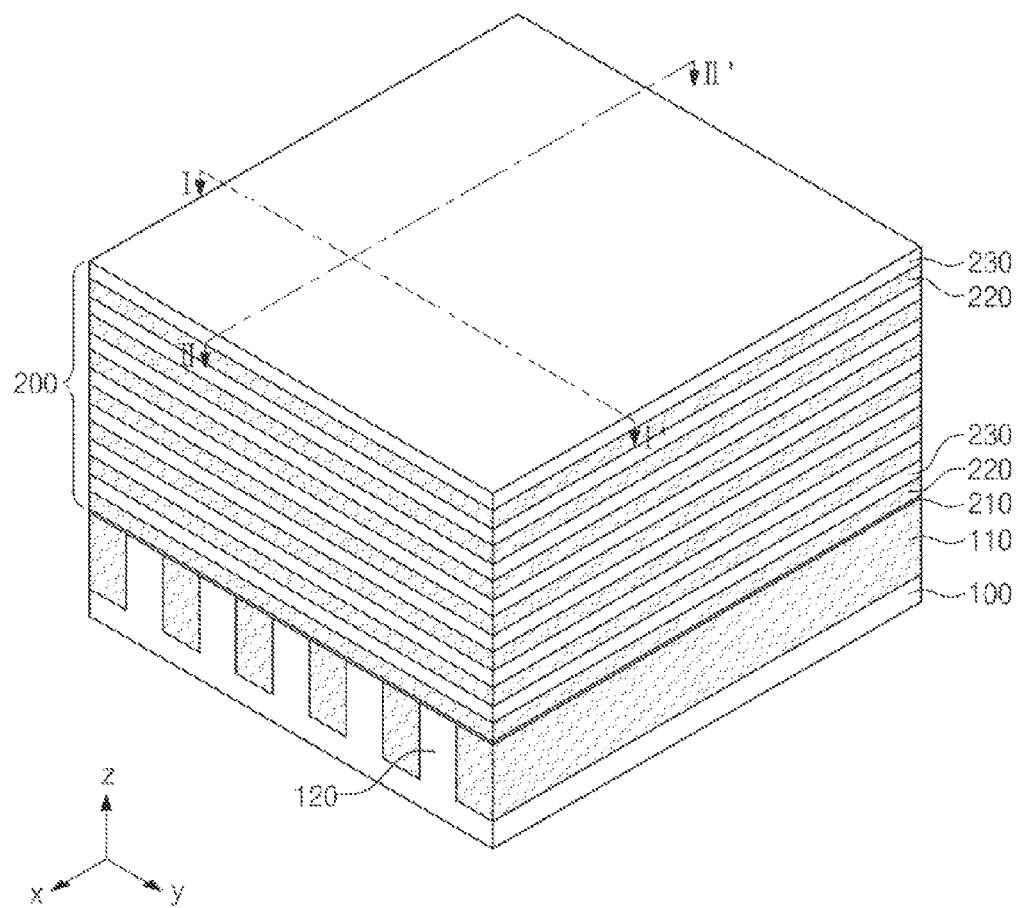
Figure 4B:
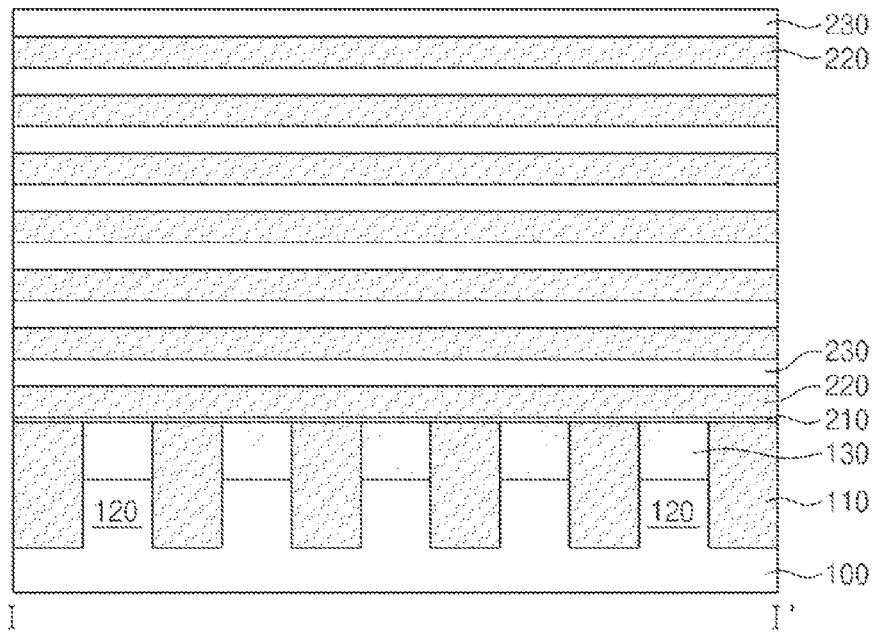
Figure 4B:
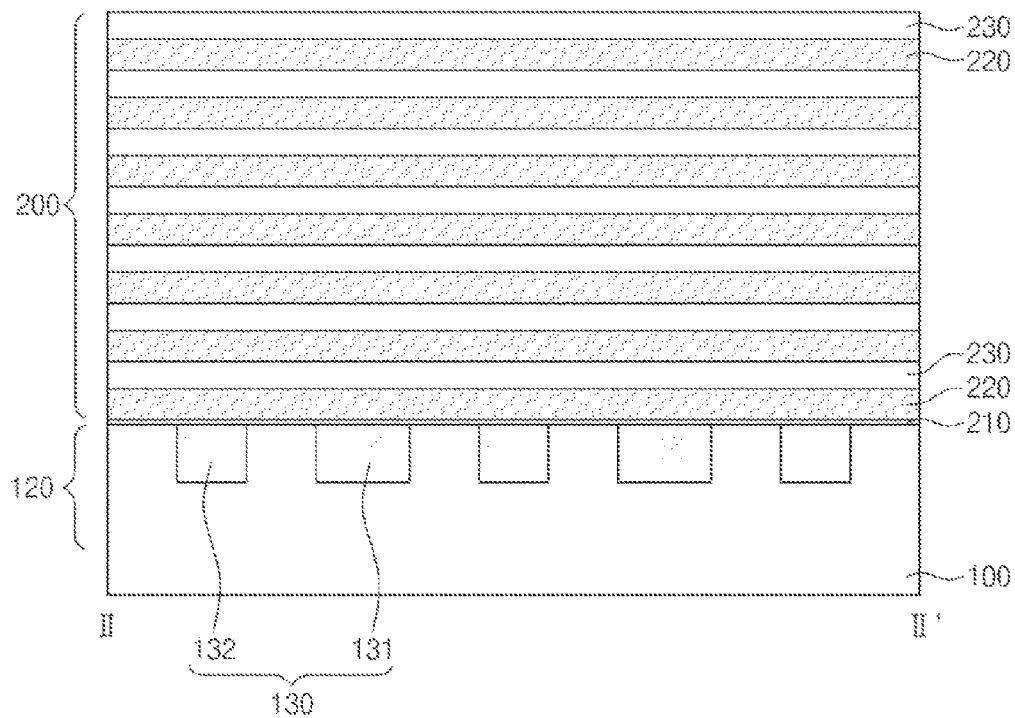

Referring to FIGS. 4A and 4B, a gate insulating layer 210 may be formed on the structure provided with the doped regions 130, and a layered structure 200 may be formed on the gate insulating layer 210. The layered structure 200 may include a plurality of sacrificial layers 220 and a plurality of mold layers 230 that may be alternately stacked on the gate insulating layer 210.

The gate insulating layer 210 may include at least one of silicon oxide and high-k dielectric materials such as hafnium oxide, aluminum oxide, zirconium oxide, but example embodiments are not limited thereto. In example embodiments, the gate insulating layer 210 may be formed by thermally oxidizing a top surface of the active region 120. Alternatively, the gate insulating layer 210 may be a deposition layer formed using a deposition technique.

The sacrificial layers 220 may be formed of a material, which can be etched with an etch selectivity with respect to the mold layers 230. For example, a material for the sacrificial layer 220 may be selected to limit (and/or prevent) the mold layers 230 from being etched in a subsequent process of etching the sacrificial layer 220. The etch selectivity may be quantitatively expressed as a ratio of an etch rate of a material of the sacrificial layer 220 to a material of the mold layer 230. In example embodiments, the sacrificial layer 220 may be one or more materials providing an etch selectivity of about 1:10 to about 1:200, e.g., about 1:30 to about 1:100, with respect to one or more materials of the mold layer 230. For example, the mold layer 230 may be at least one of a silicon oxide and a silicon nitride, and the sacrificial layer 220 may be at least one of silicon, a silicon oxide, a silicon carbide, and silicon nitride. The sacrificial layer 220 may be selected to be a different material from the mold layer 230. In the following description, for easier understanding of example embodiments of inventive concepts, example embodiments will be described with respect to a mold layer 230 including silicon oxide and to a sacrificial layer 220 including silicon nitride. However, example embodiments are not limited to silicon oxide and silicon nitride, and each layer is not limited to a single material.

Figure 5A:
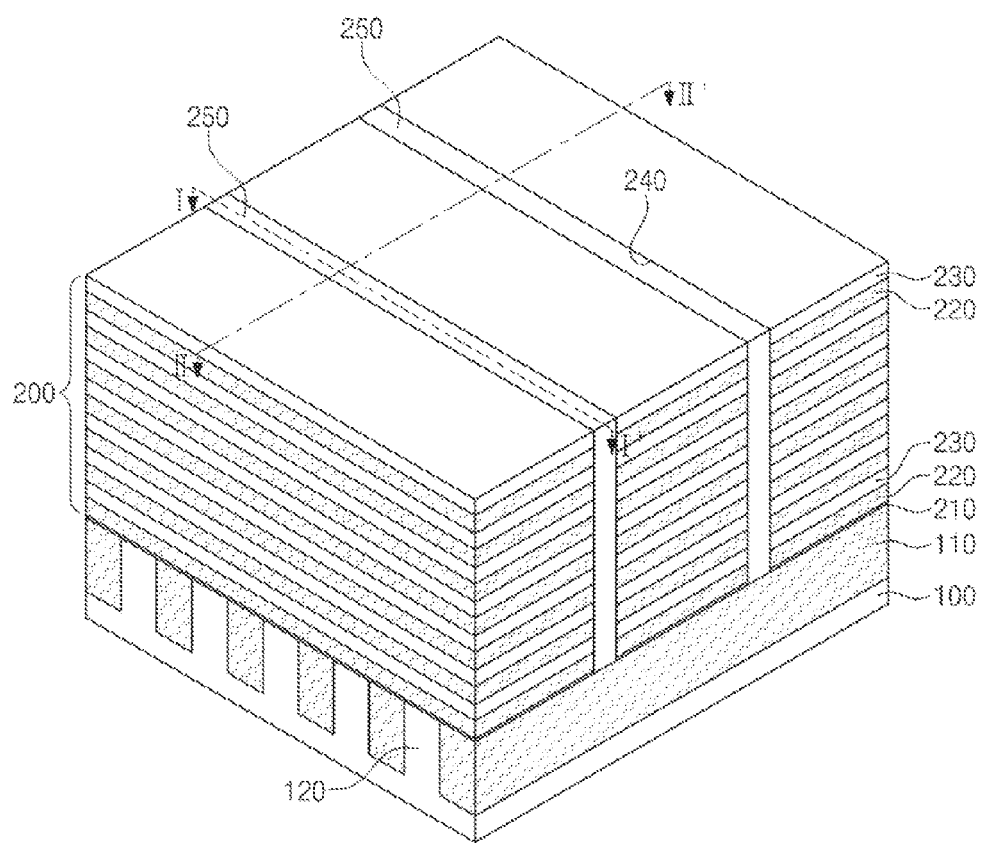
Figure 5B:
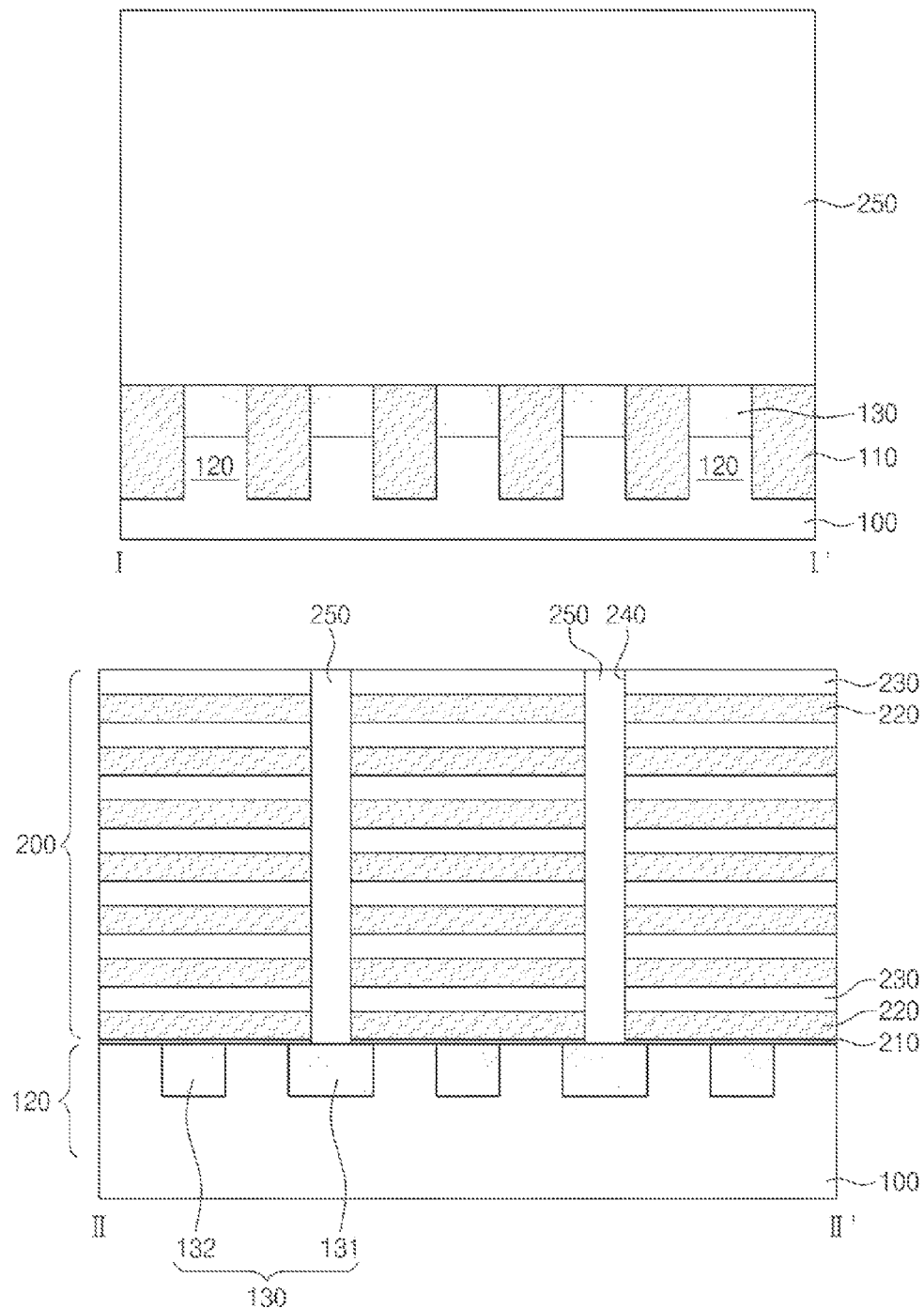

Referring to FIGS. 5A and 5B, the layered structure 200 may be patterned to form first trenches 240, and then a first gap-filling layer 250 may be formed to fill the first trenches 240.

The first trenches 240 may be formed to expose several of the doped regions 130, and each of them may be formed to cross the device isolation patterns 110. In example embodiments, the first trenches 240 may be formed to expose the first doped regions 131.

The first gap-filling layer 250 may include at least one insulating material. For example, the first gap-filling layer 250 may include at least one of spin-on-glass (SOG) materials and silicon oxide. In example embodiments, the first gap-filling layer 250 may be formed of a material having an etch selectivity with respect to the sacrificial layers 220 and the mold layers 230.

Figure 6A:
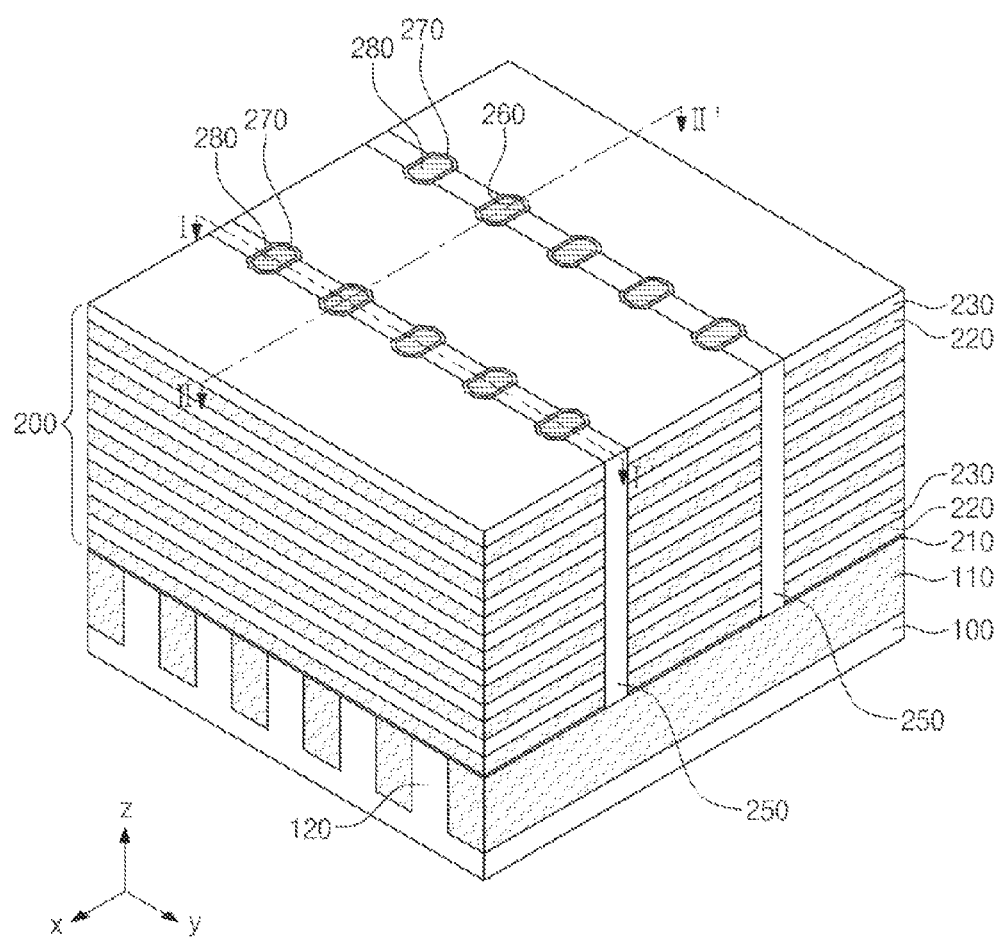
Figure 6B:
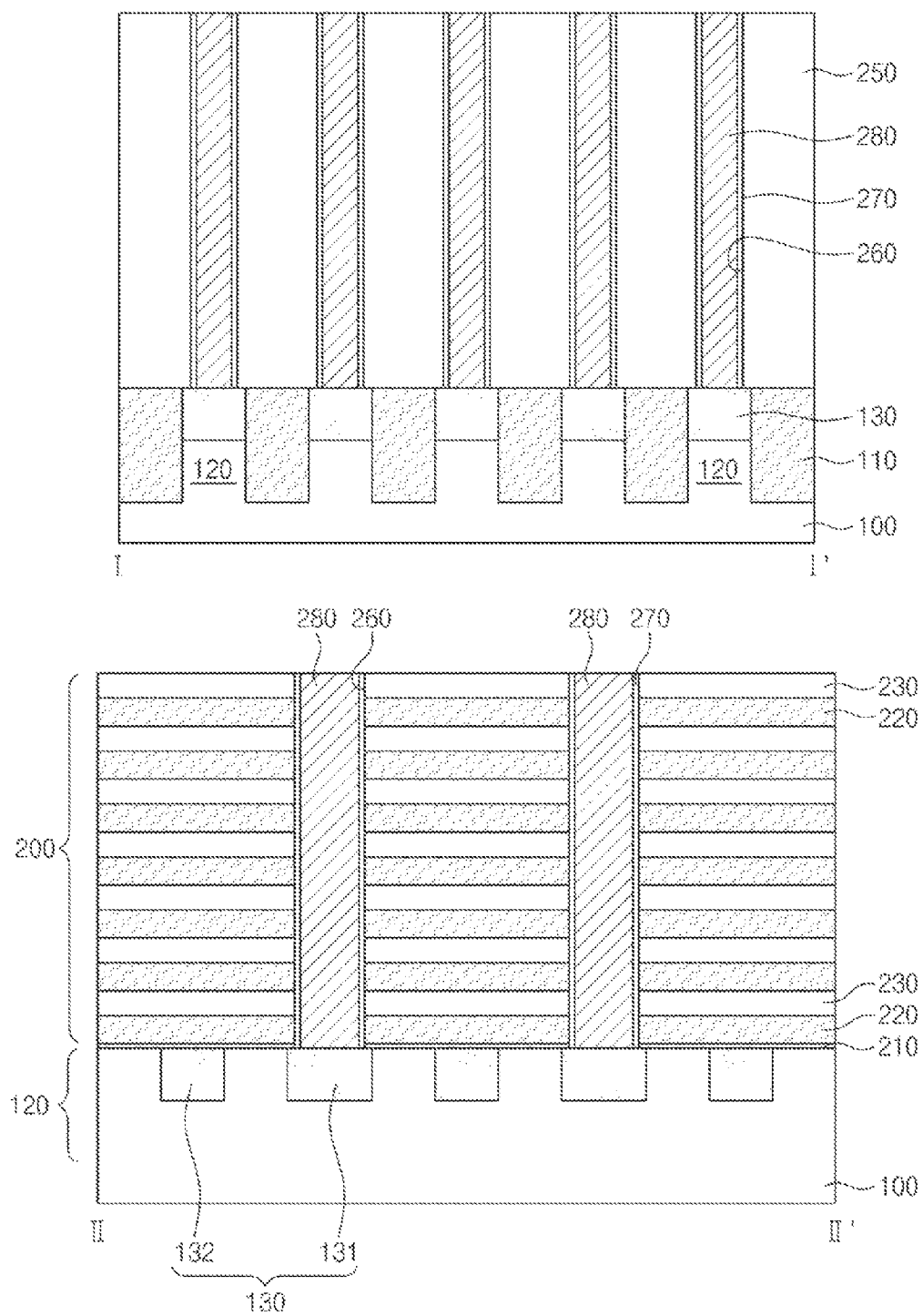

Referring to FIGS. 6A and 6B, vertical holes 260 may be formed to expose the first doped regions 131 positioned below the first trenches 240. Thereafter, memory patterns 270 may be formed to cover inner walls of the vertical holes 260 and then first plugs 280 may be formed to fill the remaining spaces of the vertical holes 260.

The formation of the vertical holes 260 may include forming a mask pattern on the layered structure 200, and then patterning the first gap-filling layer 250 using the mask pattern as an etch mask. In example embodiments, each of the vertical holes 260 may be formed to have a width greater than the first trench 240, as shown in FIG. 6A.

The memory pattern 270 may include at least one data-storing material. For example, the memory pattern 270 may include at least one of variable resistance materials whose electric resistance may be selectively changed by an electric current flowing through the memory pattern 270.

In example embodiments, the memory pattern 270 may include at least one material (e.g., chalcogenides) whose electric resistance may be changed using thermal energy applied thereto. The chalcogenides may be a material including at least one of antimony (Sb), tellurium (Te), or selenium (Se). For example, the memory pattern 270 may include a chalcogenide formed of tellurium (Te) having about 20 to about 80 atomic percent concentration, antimony (Sb) having about 5 to about 50 atomic percent concentration, and germanium (Ge) having the remaining concentration. In addition, the chalcogenide for the memory pattern 270 may further include impurities of at least one of N, O, C, Bi, In, B, Sn, Si, Ti, Al, Ni, Fe, Dy, or La. In example embodiments, the memory pattern 270 may be formed of one of GeBiTe, InSb, GeSb, and GaSb.

In example embodiments, the memory pattern 270 may include at least one of perovskite compounds or transition metal oxides. For example, the memory pattern 270 may include at least one of niobium oxide, titanium oxide, nickel oxide, zirconium oxide, vanadium oxide, PCMO((Pr,Ca)MnO$_3$), strontium-titanium oxide, barium-strontium-titanium oxide, strontium-zirconium oxide, barium-zirconium oxide, or barium-strontium-zirconium oxide. Furthermore, in example embodiments, the memory pattern 270 may be formed of at least one material that can exhibit a self-rectifying property or a nonlinear electric current-voltage property, in addition to the data-storing property.

Each of the first plugs 280 may include at least one conductive material, such as doped semiconductors, metals, conductive metal nitrides, silicide, and nano structures (e.g., carbon nanotube or graphene)).

In example embodiments, each of the memory patterns 270 may be used as the memory elements ME described with reference to FIG. 1, and each of the first plugs 280 may be used as the vertical electrode VE described with reference to FIG. 1.

Figure 7A:
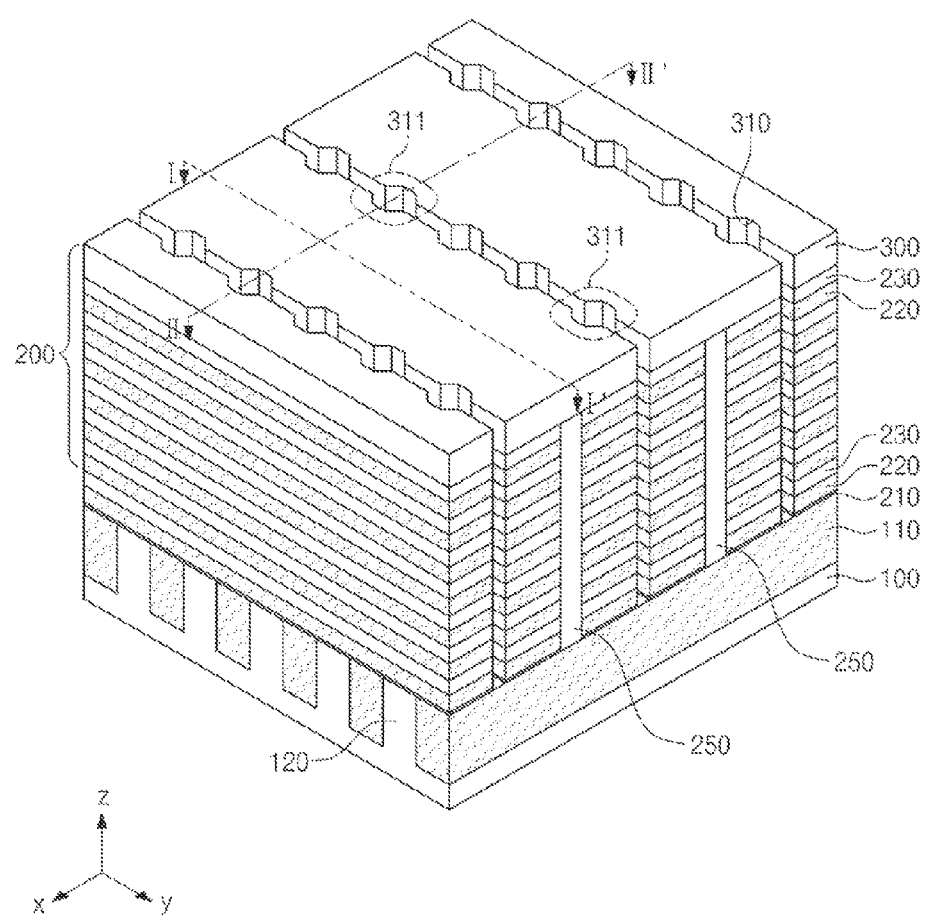
Figure 7B:
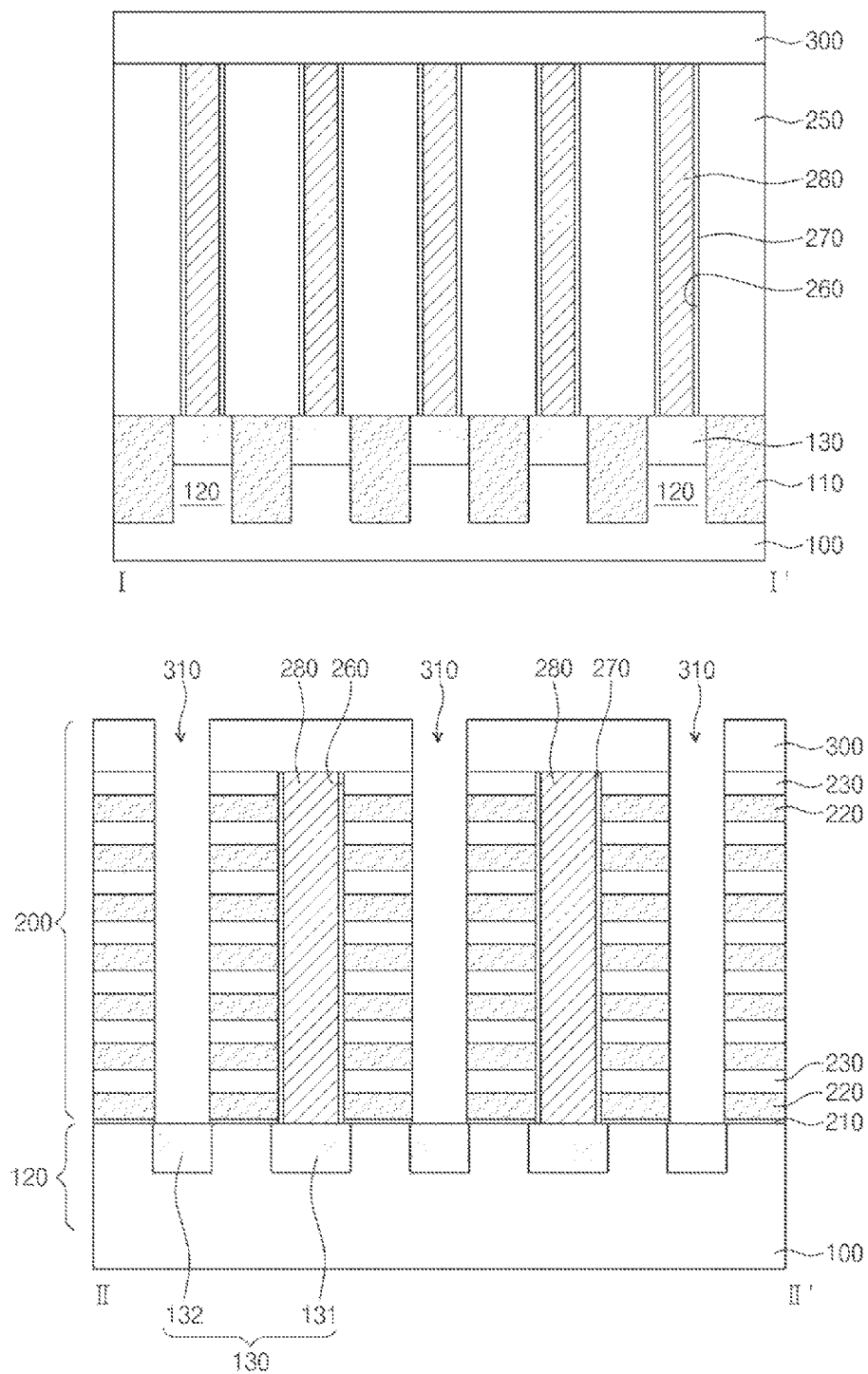

Referring to FIGS. 7A and 7B, the layered structure 200 may be patterned to form second trenches 310 exposing the remaining ones of the doped regions 130. In example embodiments, the formation of the second trenches 310 may include forming a capping mask pattern 300 to cover the structure provided with the first plugs 280, and then anisotropically etching the layered structure 200 using the capping mask pattern 300 as an etch mask.

Each of the second trenches 310 may be formed to cross the device isolation patterns 110. In example embodiments, the second trenches 310 may expose the second doped regions 132. Sidewalls of the sacrificial layers 220 and the mold layers 230 may be exposed by the second trenches 310.

As shown in FIG. 7A, in example embodiments, each of the second trenches 310 may include narrow regions and wide regions 311 having widths greater than the narrow regions. In each second trench 310, the narrow regions and the wide regions 311 may be alternately arranged and be connected with each other. Each of the wide regions 311 may be formed to expose the corresponding one of the second doped regions 132, and each of the narrow regions may be formed to cross the corresponding one of the device isolation patterns 110. In example embodiments, the second trenches 310 may be patterned using the capping mask pattern 300 as a hard mask.

Figure 8A:
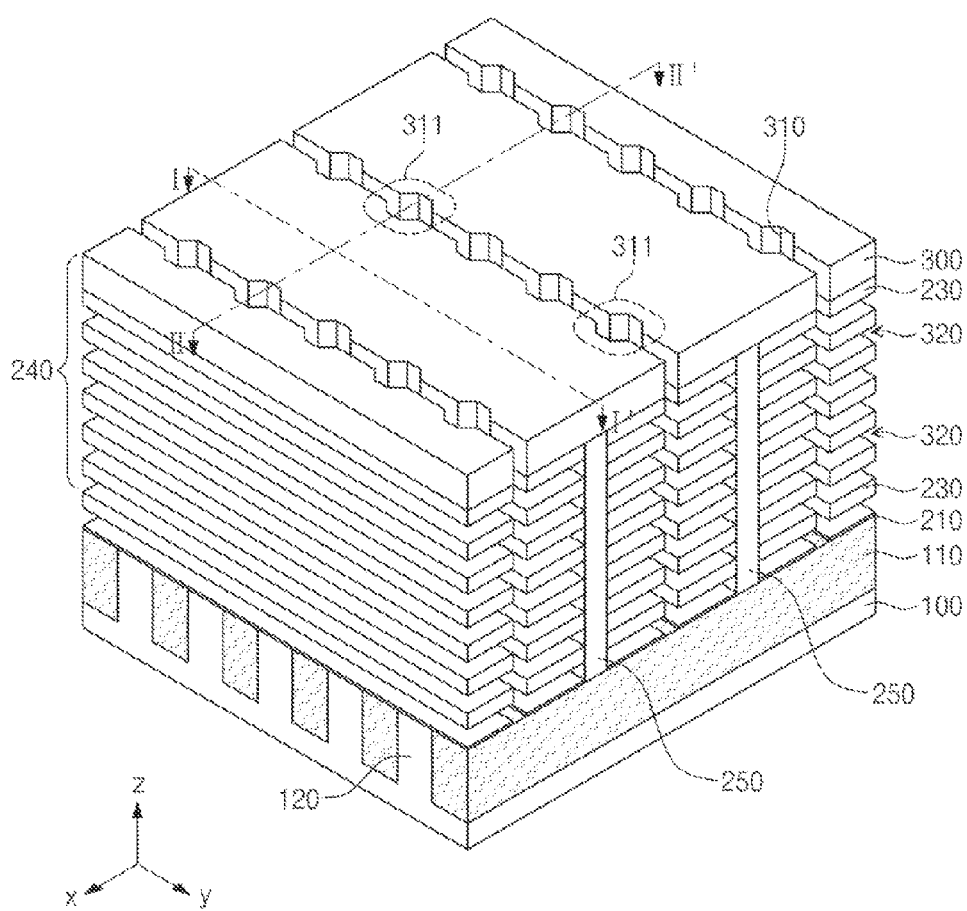
Figure 8B:
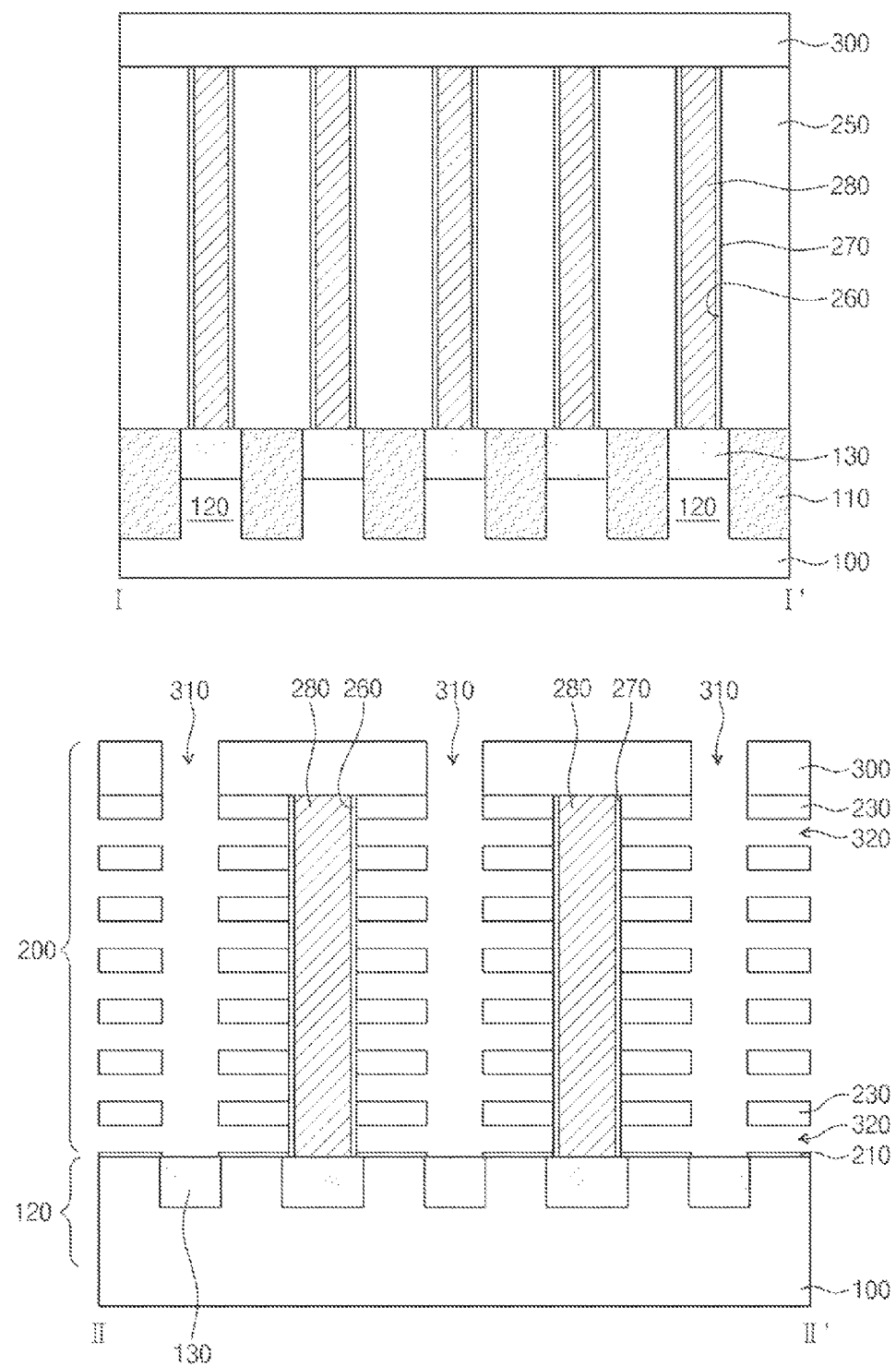

Referring to FIGS. 8A and 8B, the sacrificial layers 220 may be selectively removed to form recess regions 320 between the mold layers 230. The formation of the recess regions 320 may include laterally etching the sacrificial layers 220, which are exposed by the second trenches 310, for example, using an isotropic etching technique.

Since the second trenches 310 are shaped like lines crossing the device isolation patterns 110, the selective removal of the sacrificial layers 220 can be performed. For example, an etchant can be supplied to the sacrificial layers 220, due to the presence of the linear second trenches 310.

The recess regions 320 may extend to boundaries of the first trenches 240. For example, the recess regions 320 may be formed to expose outer sidewalls of the first gap-filling layer 250 and the memory patterns 270.

Figure 9A:
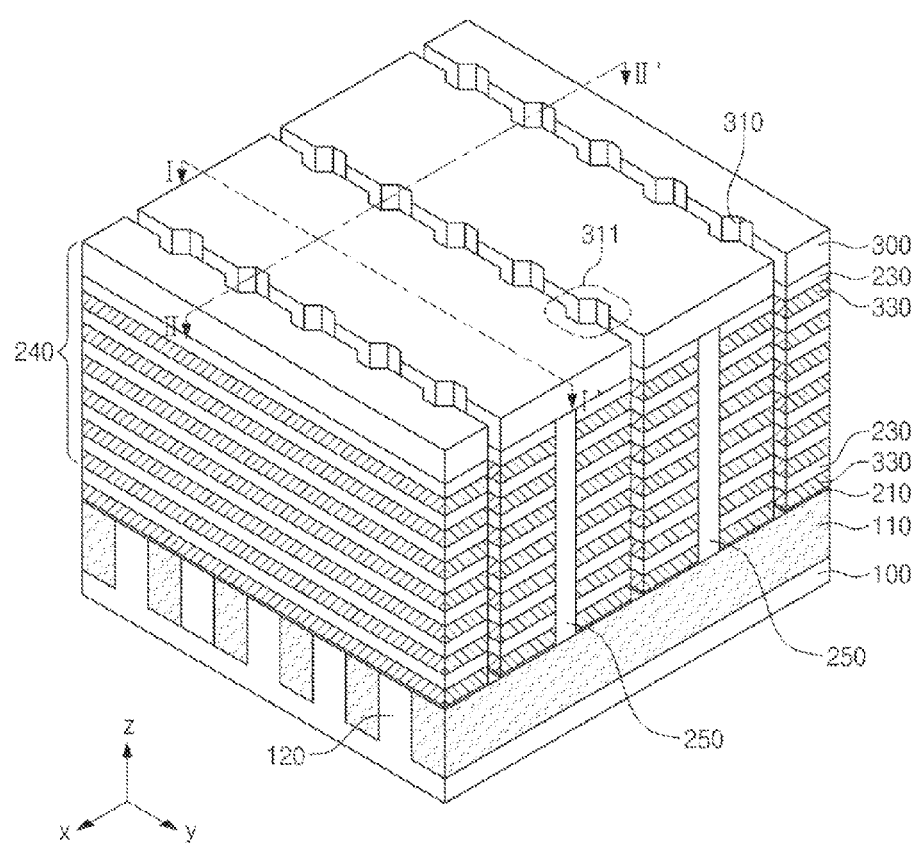
Figure 9B:
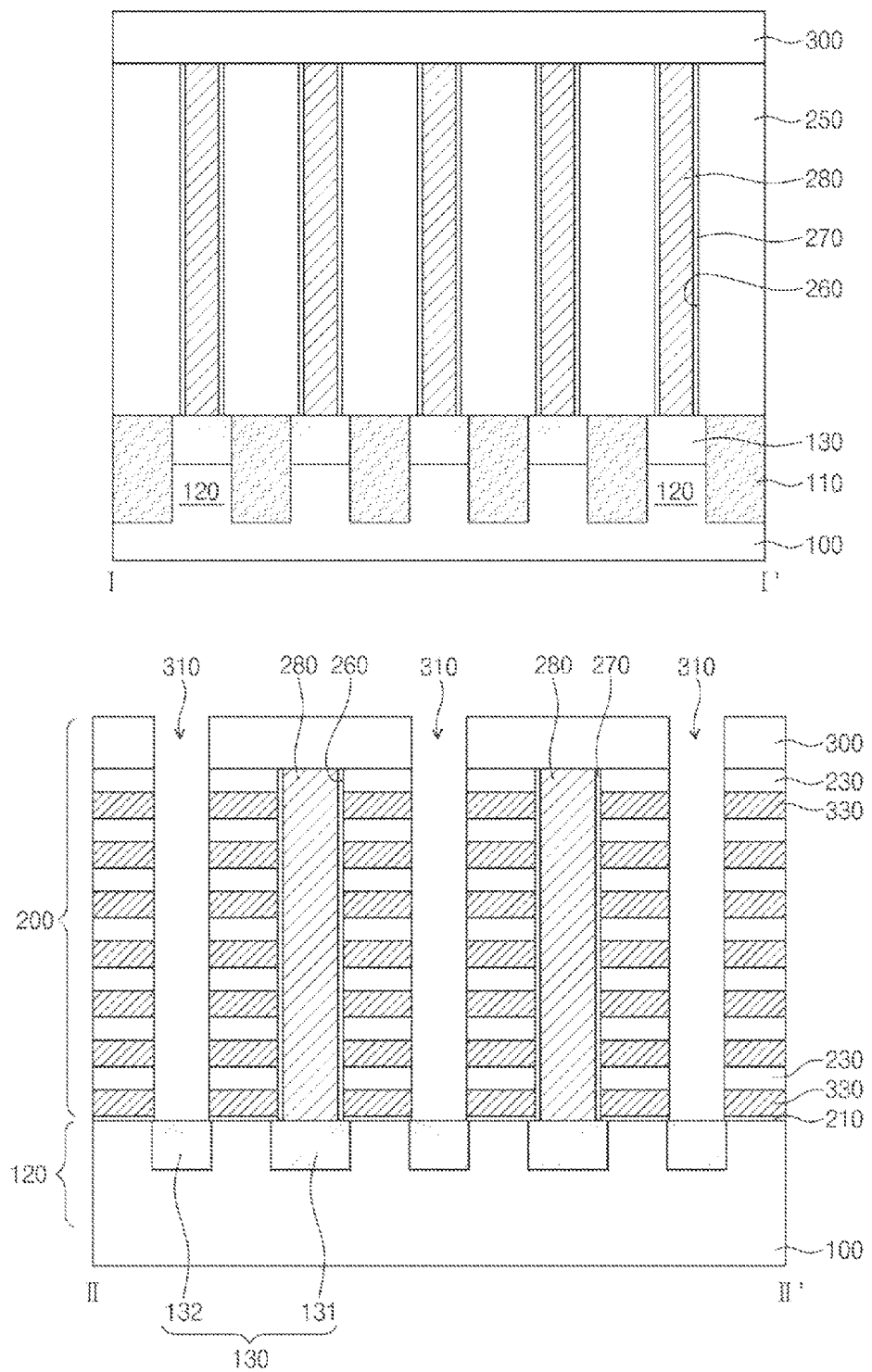

Referring to FIGS. 9A and 9B, horizontal electrodes 330 may be formed to fill the recess regions 320. Each of the horizontal electrodes 330 may be formed to fill the corresponding one of the recess regions 320. In example embodiments, the horizontal electrodes 330 may serve as the word lines WL and the selection line SL, which are described with reference to FIG. 1.

The formation of the horizontal electrodes 330 may include forming a conductive layer to fill the recess regions 320 and removing the conductive layer from the second trench 310 to localize the conductive layer into internal spaces of the recess regions 320. In example embodiments, the conductive layer may be formed not to fill the whole region of the second trench 310; for example, it may be formed to cover conformally an inner surface of the second trench 310. In this case, the removal of the conductive layer may be performed using an isotropic etching process (for example, a wet etching process).

The horizontal electrodes 330 may include at least one conductive material. For example, the horizontal electrodes 330 may be formed of doped semiconductors, metals, or metal nitrides. In the case in which the horizontal electrodes 330 are formed of metallic materials or metal nitrides, the semiconductor memory device according to inventive concepts can realize an improved operation speed.

Figure 10A:
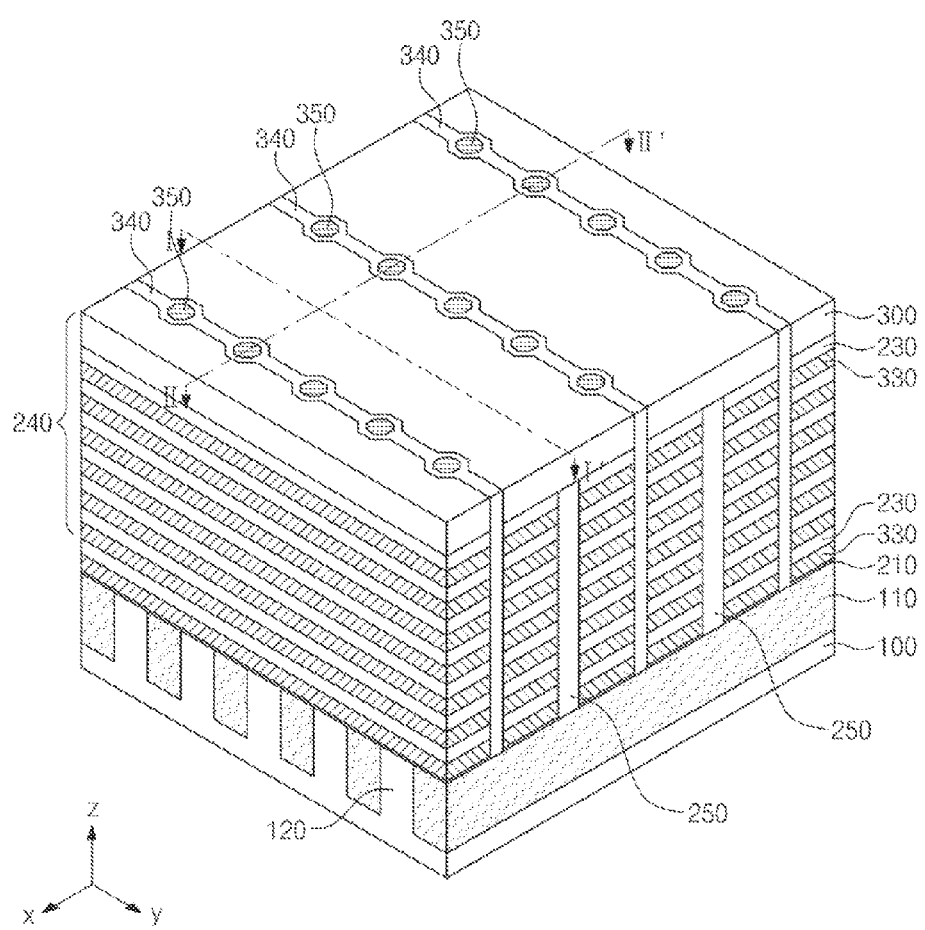
Figure 10B:
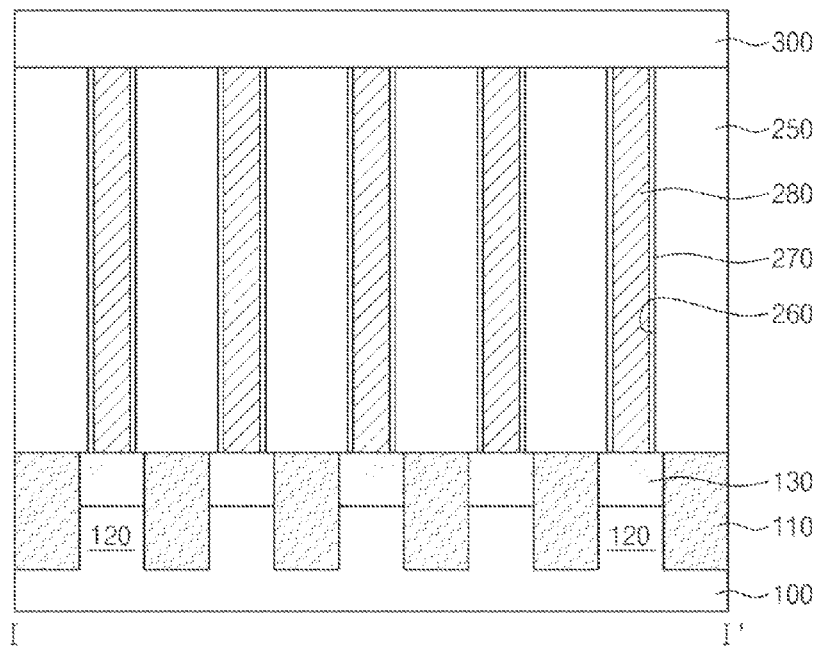
Figure 10B:
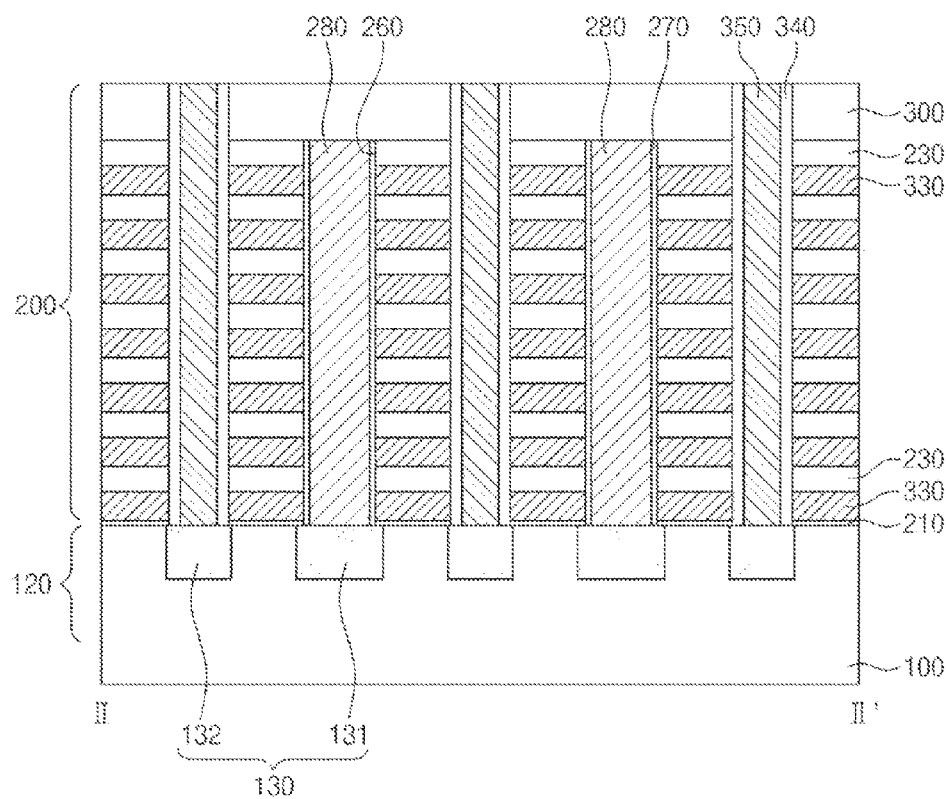

Referring to FIGS. 10A and 10B, second plugs 350 may be formed in such a way that each of them is connected to the corresponding one of the second doped regions 132. In example embodiments, each of the second plugs 350 may serve as the bit line plug BLP described with reference to FIG. 1. The formation of the second plugs 350 may include forming a second gap-filling layer 340 to fill the second trenches 310, and forming the second plugs 350 to penetrate the second gap-filling layer 340.

In example embodiments, the second gap-filling layer 340 may be formed using one of deposition techniques, and a deposition thickness thereof may range from half a width of the narrow region to half a width of the wide region 311. In this case, the narrow regions of the second trench 310 are completely filled with the second gap-filling layer 340, while the wide regions 311 are incompletely filled with the second gap-filling layer 340. For example, the afore-described condition of deposition thickness enables the second gap-filling layer 340 to have openings formed in the wide regions 311 in a self-alignment manner.

In the case in which the second gap-filling layer 340 is formed using a deposition technique, the second gap-filling layer 340 may cover bottom surfaces of the wide regions 311. In example embodiments, an anisotropic etching process may be performed to remove the second gap-filling layer 340 from the bottom surfaces of the wide regions 311, before the formation of the second plugs 350.

The formation of the second plugs 350 may include forming a conductive layer on the resultant structure, on which the anisotropic etching process is performed, and then performing a node separation process. The conductive layer may be formed to fill the openings provided in the wide regions 311 and be connected to the second doped regions 132. As the result of the node separation process, the second plugs 350 may be two-dimensionally separated from each other; that is, each of them may be localized in the corresponding one of the wide regions 311.

Figure 11A:
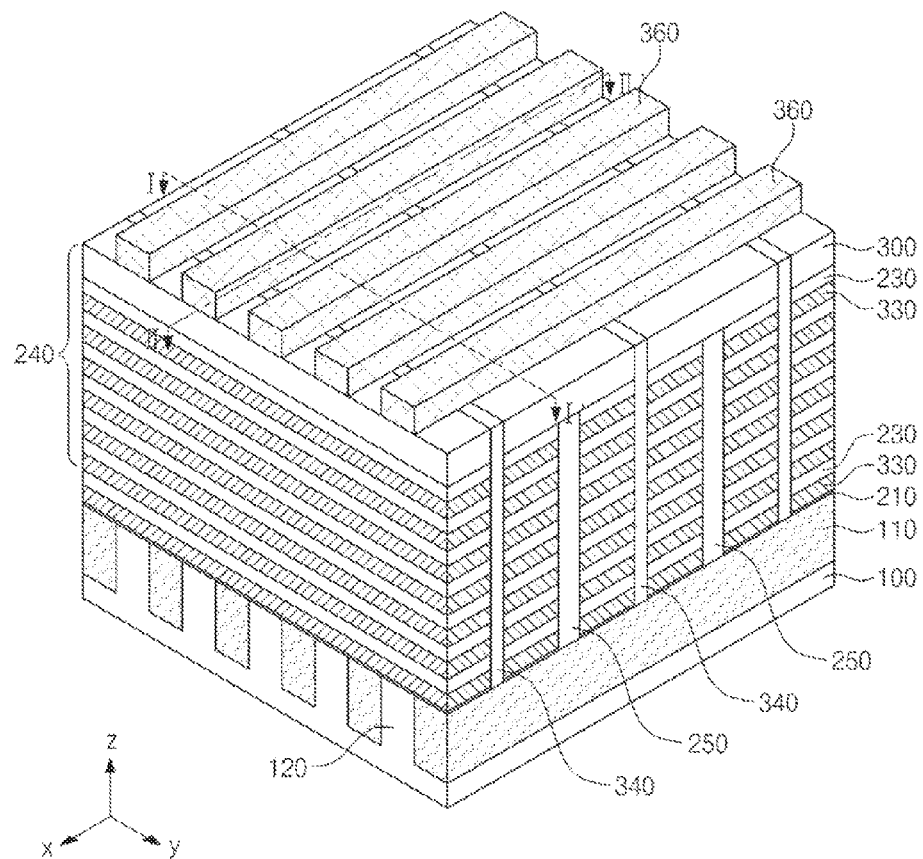
Figure 11B:
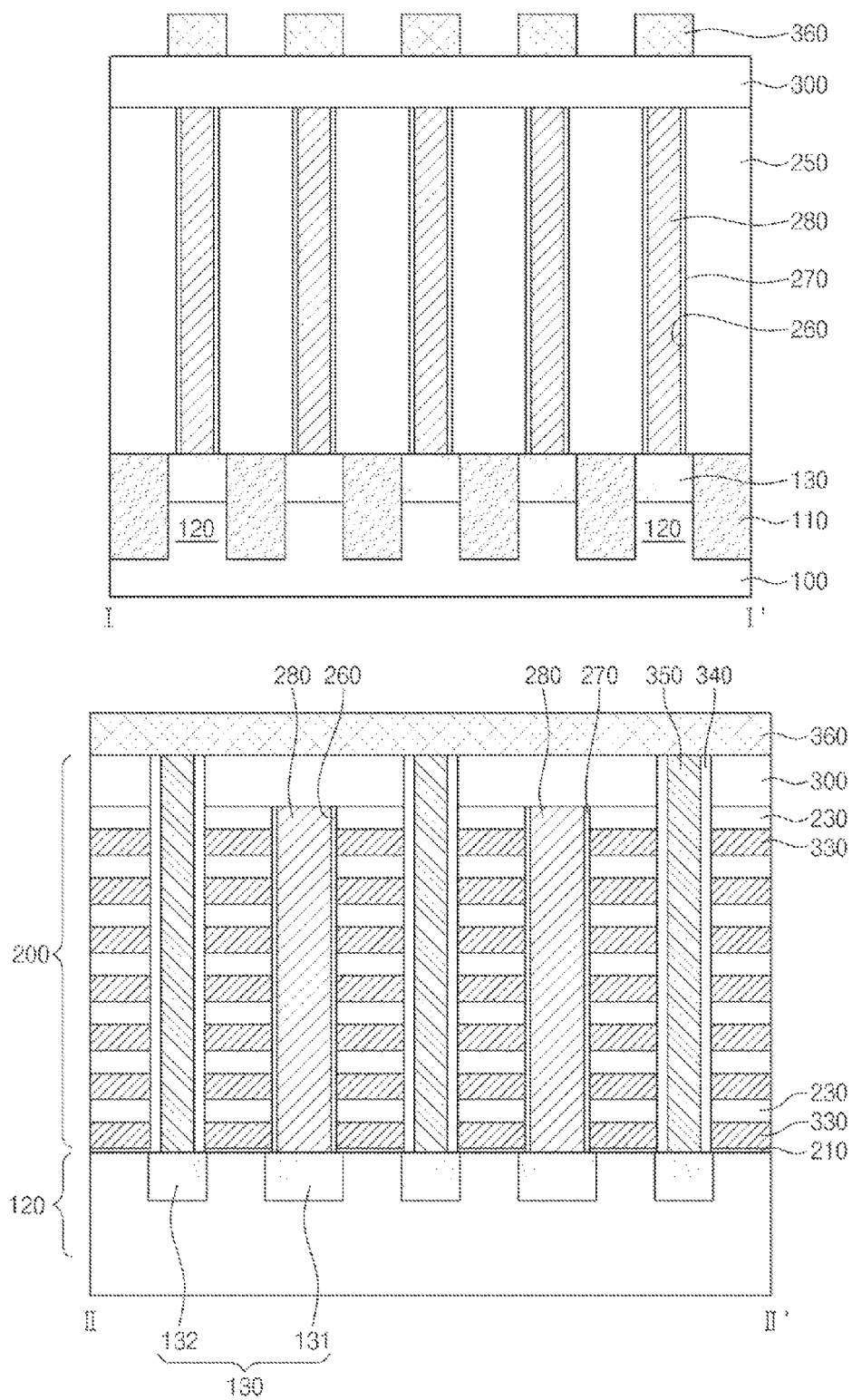

Referring to FIGS. 11A and 11B, upper interconnection lines 360 may be formed on the second plugs 350. The upper interconnection lines 360 may be formed to cross the first and second trenches 240 and 310 or the horizontal electrodes 330, and each of the upper interconnection lines 360 may be connected to several ones of the second plugs 350 positioned thereunder. In example embodiments, each of the upper interconnection lines 360 may serve as the bit line BL described with reference to FIG. 1.

Figure 12A:
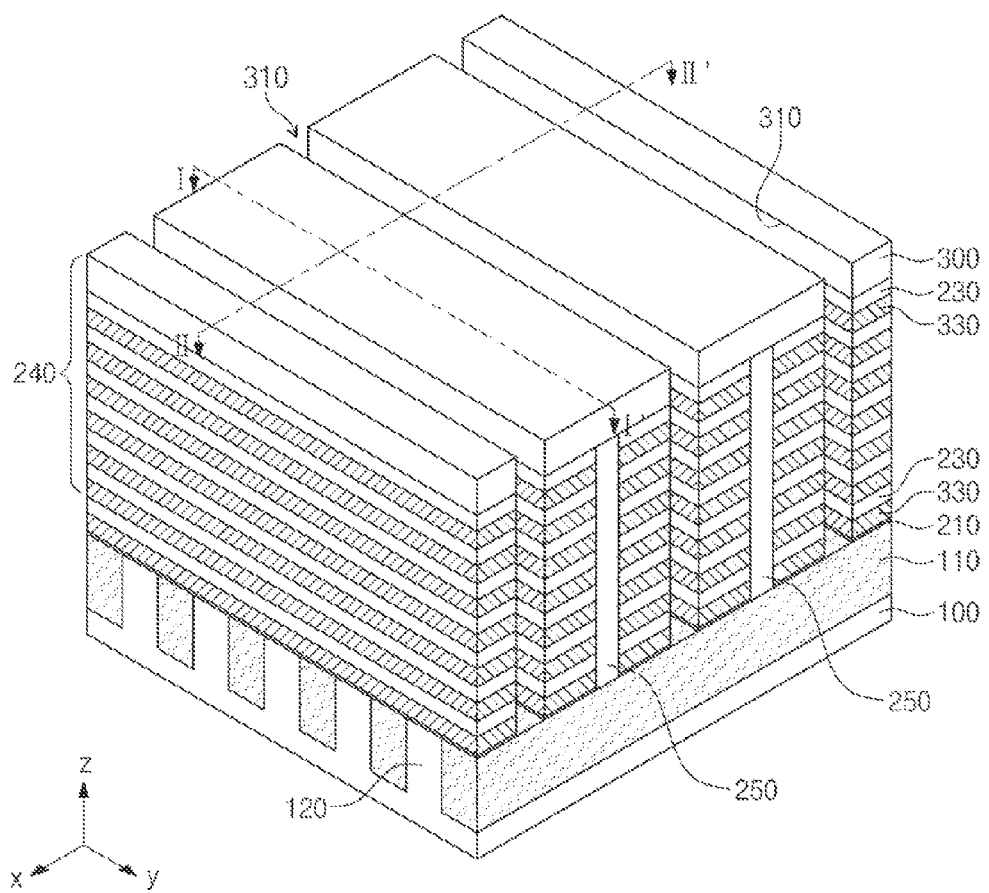
FIGS. 12A and 13A are perspective views illustrating a method of fabricating a 3D semiconductor device according to example embodiments of inventive concepts.
Figure 12B:
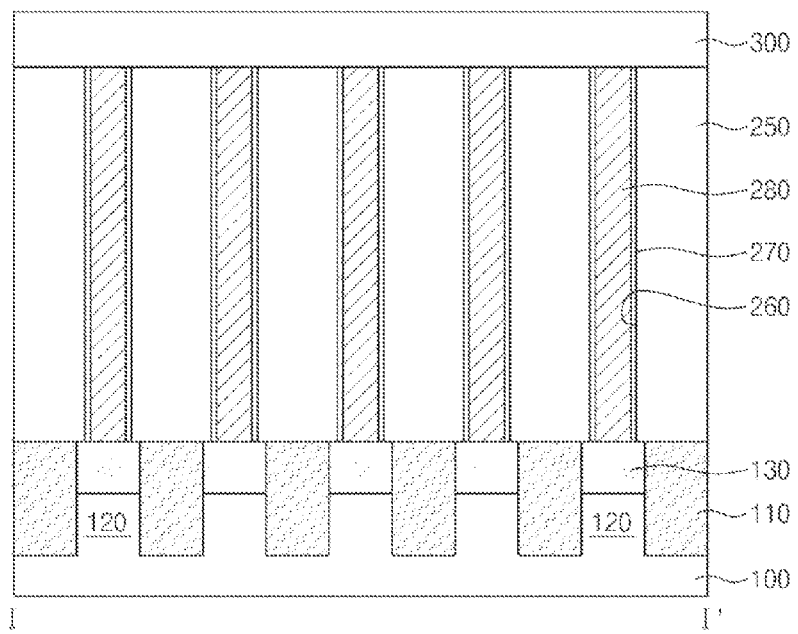
FIGS. 12B and 13B are sectional views taken along lines I-I and II-II of FIGS. 12A and 13A, respectively.
Figure 12B:
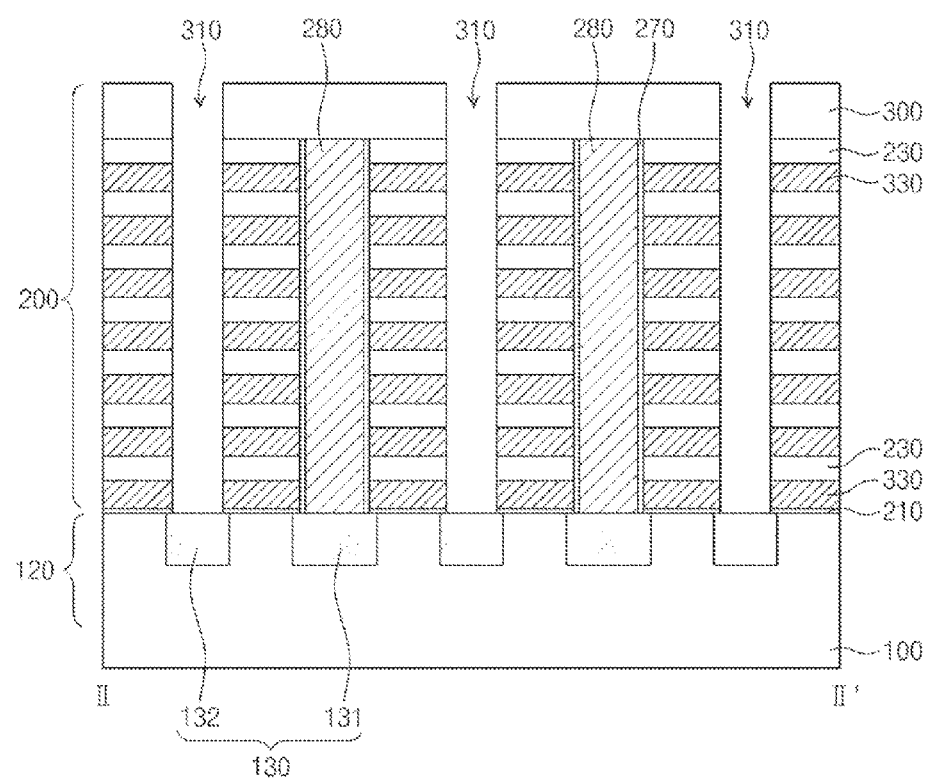
Figure 13A:
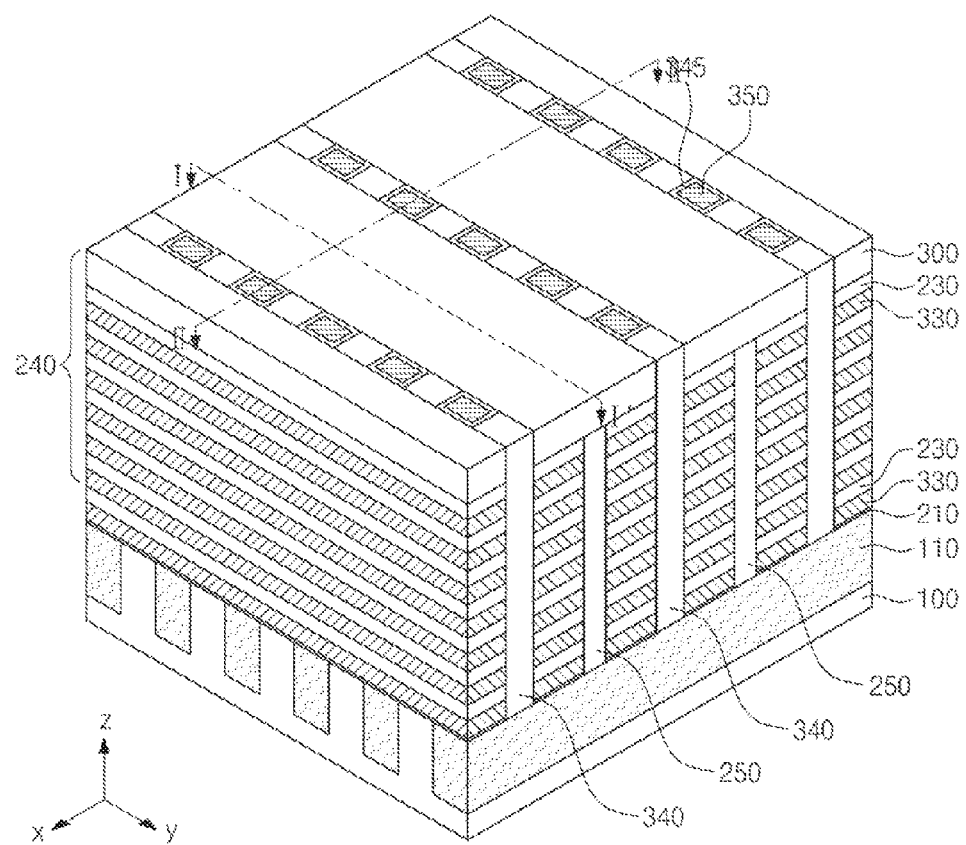
Figure 13B:
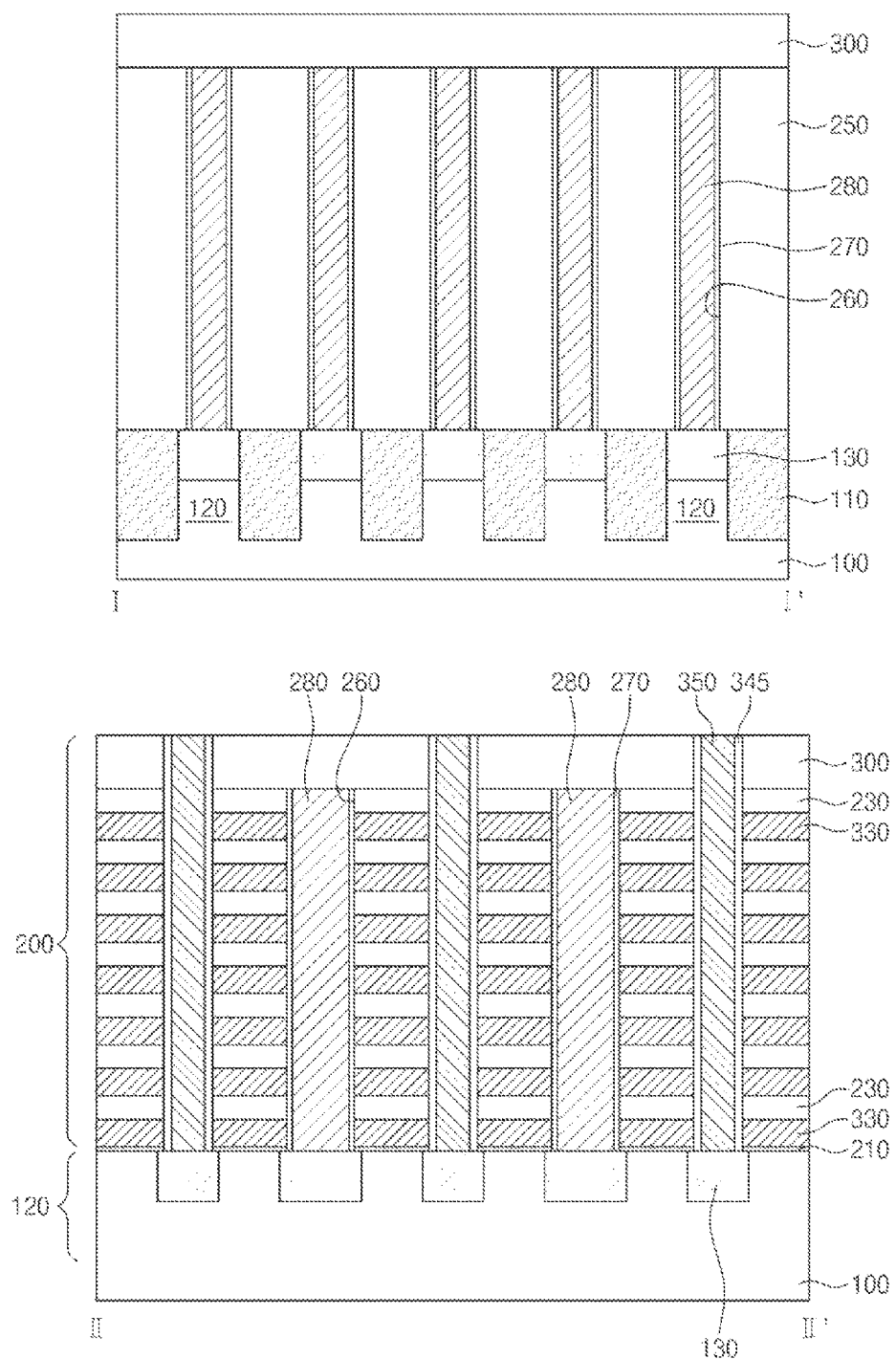

FIGS. 12A and 13A are perspective views illustrating a method of fabricating a 3D semiconductor device according to other example embodiments of inventive concepts, and FIGS. 12B and 13B are sectional views taken along lines I-I and II-II of FIGS. 12A and 13A, respectively. For the sake of brevity, the elements and features of this example that are similar to those previously shown and described with reference to FIGS. 2A through 11A will not be described in much further detail. The fabrication method according to example embodiments that is illustrated in FIGS. 12A, 12B, 13A, and 13B may differ from the method according to example embodiments described with reference to FIGS. 2A through 11A, in at least two aspects.

Firstly, as shown in FIGS. 12A and 12B, a width of the second trench 310 may be substantially uniform, when it is measured along a direction of the longitudinal axis thereof. For example, a width of the second trench 310 on the device isolation pattern 110 may be equivalent to that on the second doped region 132. Secondly, the horizontal electrodes 330 may be provided as parts of the layered structure 200, not by an additional process performed after the formation of the second trenches 310. In other words, the layered structure 200 may include a plurality of conductive layers and a plurality of insulating layers that may be alternately stacked on the gate insulating layer 210. In these examples, due to the formation of the second trenches 310, the conductive and insulating layers of the layered structure 200 may serve as the horizontal electrodes 330 and the mold layers 230, respectively, of the afore-described embodiment.

Since the second trench 310 is formed to have a uniform width, there may be a difficulty in forming the second plugs 350 in a self-alignment manner described with reference to FIG. 10A. According to example embodiments of inventive concepts, as shown in FIGS. 13A and 13B, the formation of the second plugs 350 may include forming the second gap-filling layer 340 to completely fill the second trenches 310, patterning the second gap-filling layer 340 to form openings exposing the second doped regions 132, and then, filling the openings with a conductive material. In example embodiments, insulating spacers 345 may be additionally formed to cover sidewalls of the second plugs 350, respectively, and by virtue of the presence of the insulating spacers 345, the second plugs 350 can be electrically separated from the horizontal electrodes 330.

The remaining steps of the fabrication process may be performed in the same manner as those described with reference to FIGS. 2A through 11A.

Figure 14A:
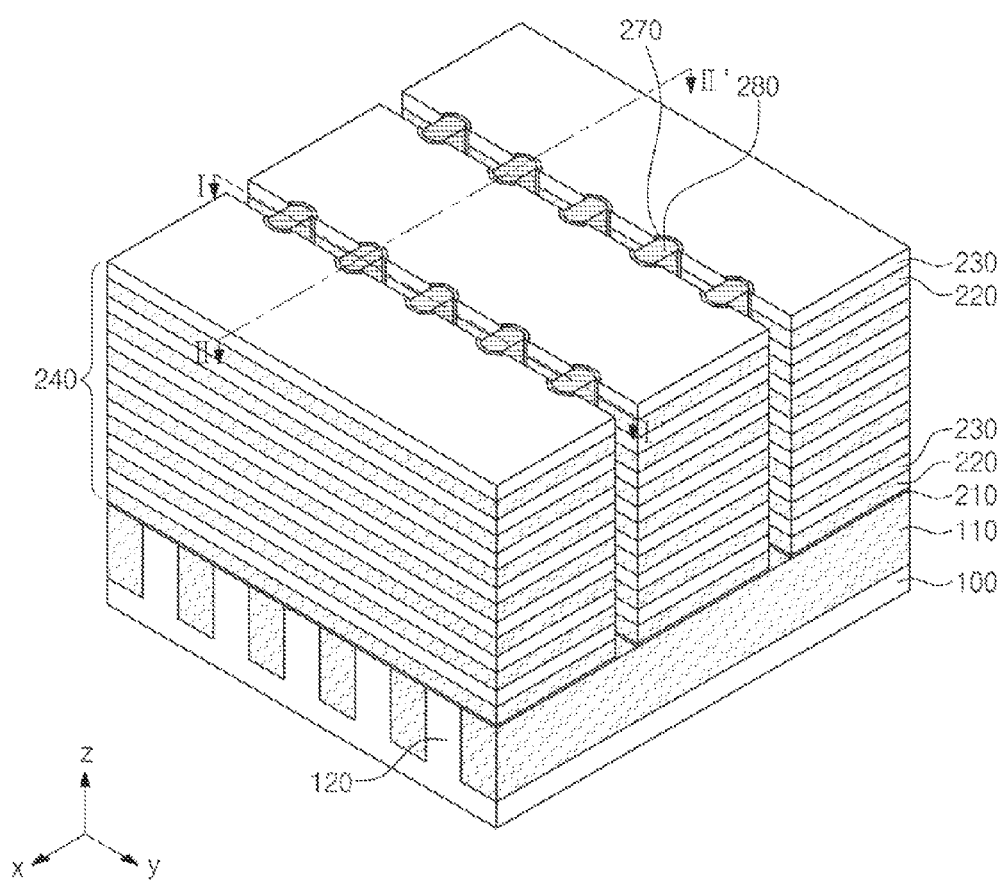
FIG. 14A are a perspective view illustrating a method of fabricating a 3D semiconductor device according to example embodiments of inventive concepts.
Figure 14B:
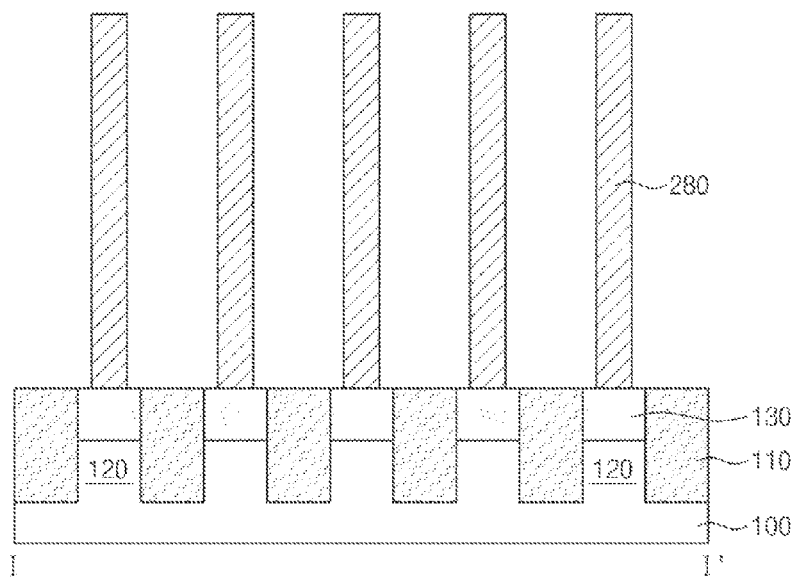
FIG. 14B is a sectional view taken along lines I-I and II-II of FIG. 14A.
Figure 14B:
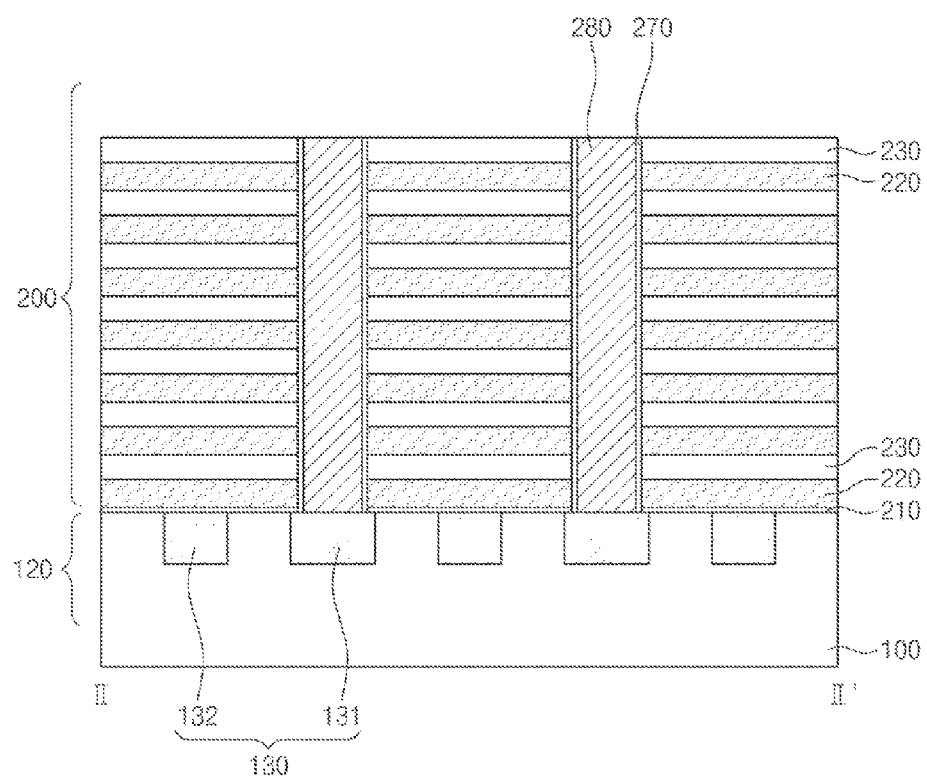

FIG. 14A are a perspective view illustrating a method of fabricating a 3D semiconductor device according to example embodiments of inventive concepts, and FIG. 14B is a sectional view taken along lines I-I and II-II of FIG. 14A. For the sake of brevity, the elements and features that are similar to those previously shown and described with reference to FIGS. 2A through 11A will not be described in much further detail.

Referring back to FIGS. 6A and 6B, the first gap-filling layer 250 may be selectively removed to re-expose the sidewalls of the memory patterns 270 through the first trenches 240. Thereafter, the exposed sidewalls of the memory patterns 270 may be etched to expose sidewalls of the first plugs 280. Accordingly, each of the memory patterns 270 may have two portions separated horizontally by the first trench 240, as shown in FIGS. 14A and 14B. Two separated portions of the memory pattern 270 can be used as independent data storages capable of storing different data from each other, and in this sense, the separation process can contribute to solving a data disturbance problem.

Thereafter, an insulating layer (e.g., the capping mask pattern 300) may be formed to fill empty spaces formed by the removal of the first gap-filling layer 250. The remaining steps of the fabrication process may be performed in the same manner as those of the previous embodiment described with reference to FIGS. 2A through 11A.

Figure 15:
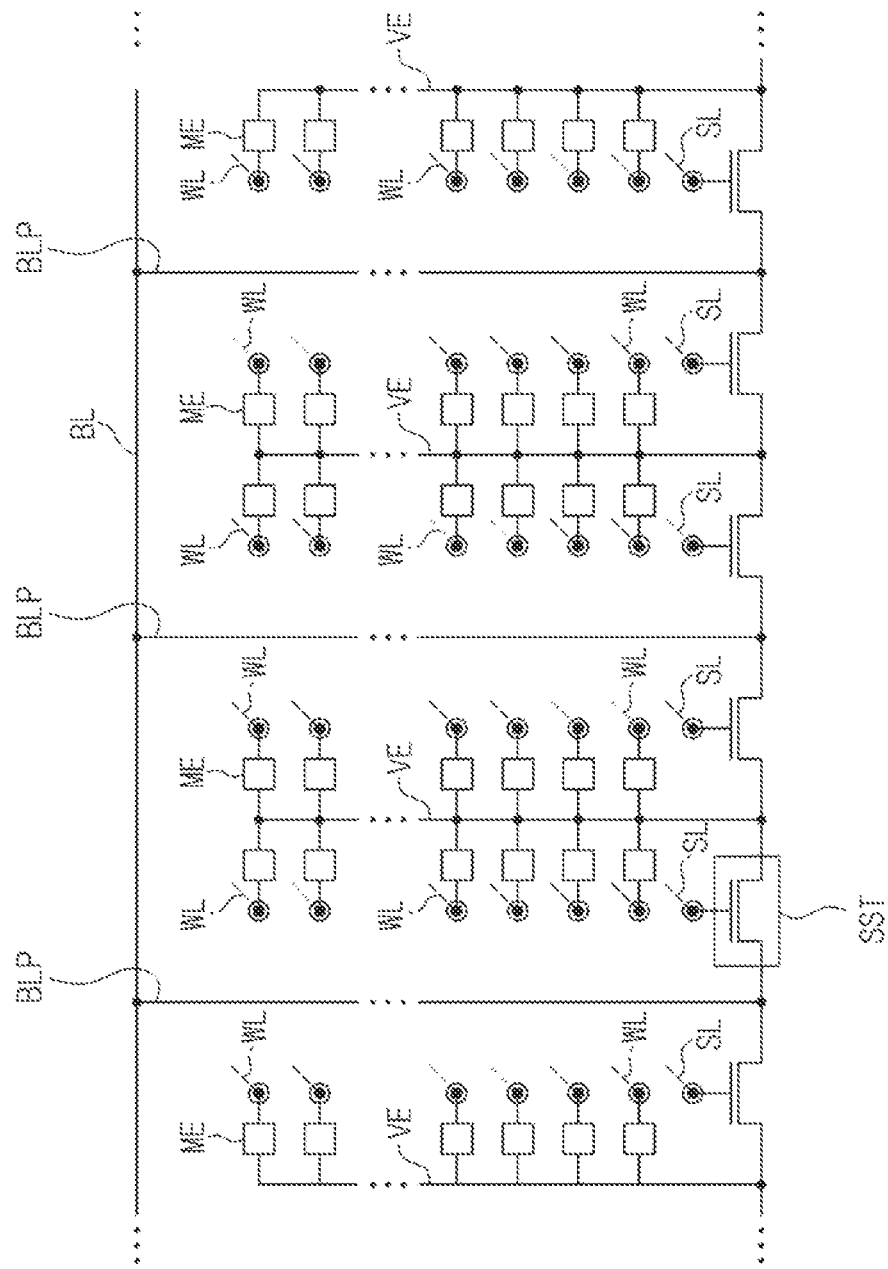
FIG. 15 is a circuit diagram illustrating a cell array region of a 3D semiconductor device according to example embodiments of inventive concepts.

FIG. 15 is a circuit diagram illustrating a cell array region of a 3D semiconductor device according to example embodiments of inventive concepts, and FIGS. 16 through 19 are perspective views schematically illustrating a cell array region of a 3D semiconductor device according to example embodiments of inventive concepts. For the sake of brevity, the elements and features of this example that are similar to those previously shown and described with reference to FIGS. 1 and 2A through 11A will not be described in much further detail.

Referring to FIG. 15, a plurality of selection transistors SST may be connected in parallel to a bit line BL via a plurality of bit line plugs BLP. Each of the bit line plugs BLP may be connected in common to a pair of the selection transistors SST disposed adjacent thereto.

A plurality of word lines WL and a plurality of vertical electrodes VE may be provided between the bit line BL and the selection transistors SST. The vertical electrodes VE may be disposed between the bit line plugs BLP. For example, the vertical electrodes VE and the bit line plugs BLP may be alternately arranged along a direction parallel to the bit line BL. In addition, each of the vertical electrodes VE may be connected in common to a pair of the selection transistors SST disposed adjacent thereto.

A plurality of memory elements ME may be connected in parallel to each of the vertical electrodes VE. Each of the memory elements ME may be connected to the corresponding one of the word lines WL. For example, each of the word lines WL may be connected to the corresponding one of the vertical electrodes VE via the corresponding one of the memory elements ME.

Each of the selection transistors SST may include a selection line SL serving as a gate electrode thereof. In example embodiments, the selection lines SL may be parallel to the word lines WL.

Referring to FIGS. 16 through 19, a plurality of upper interconnection lines 360 may be provided on a substrate 100 to serve as the bit lines BL of FIG. 15. The substrate 100 may include a plurality of active regions 120 parallel to the upper interconnection lines 360. The active regions 120 may be delimited by a plurality of device isolation patterns 110 provided in the substrate 100. In plan view, the device isolation patterns 110 may be positioned between the upper interconnection lines 360 and have longitudinal axes parallel to the upper interconnection lines 360.

In each active region 120, there may be a plurality of doped regions 130 arranged in a row along a direction parallel to the upper interconnection line 360. The doped regions 130 may be spaced apart from each other to define channel regions C. The doped regions 130 may include a plurality of first doped regions 131 and a plurality of second doped regions 132, which may be alternately arranged with each other.

A plurality of first plugs 280 may be two-dimensionally arranged on the substrate 100. The first plugs 280 may serve as the vertical electrodes VE of FIG. 15 and each of them may be connected to the corresponding one of the first doped regions 131.

A plurality of second plugs 350 may be two-dimensionally arranged on the substrate 100. The second plugs 350 may serve as the bit line plugs BLP of FIG. 15 and each of them may be connected to the corresponding one of the second doped regions 132.

A plurality of horizontal electrodes 330 may be provided on the channel regions to cross the device isolation patterns 110. The horizontal electrodes 330 may serve as the word lines WL and the selection lines SL of FIG. 15. A plurality of the horizontal electrodes 330 may be sequentially stacked on each of the channel regions. In example embodiments, the lowermost ones of the horizontal electrodes 330 may serve as the selection lines SL and the others may serve as the word lines WL.

The horizontal electrodes 330 may be horizontally spaced apart from both of the first and second plugs 280 and 350. For example, memory patterns 270 serving as the memory elements ME of FIG. 15 may be interposed between the horizontal electrodes 330 and the first plugs 280, and an insulating layer (for example, the second gap-filling layer 340 of FIGS. 10A and 10B) may be interposed between the horizontal electrodes 330 and the second plugs 350.

Each of the first plugs 280 may serve as a conductive pathway of connecting the corresponding one of the first doped regions 131 to the horizontal electrodes 330 serving as the word lines WL. For example, the first plugs 280 may be connected to the first doped regions 131 but be spaced apart from the upper interconnection lines 360. Each of the second plugs 350 may serve as a conductive pathway of connecting the corresponding one of the second doped regions 132 to the corresponding one of the bit lines BL. As described above, each of the second plugs 350 may be spaced apart from the horizontal electrodes 330 by the insulating layer.

Figure 16:
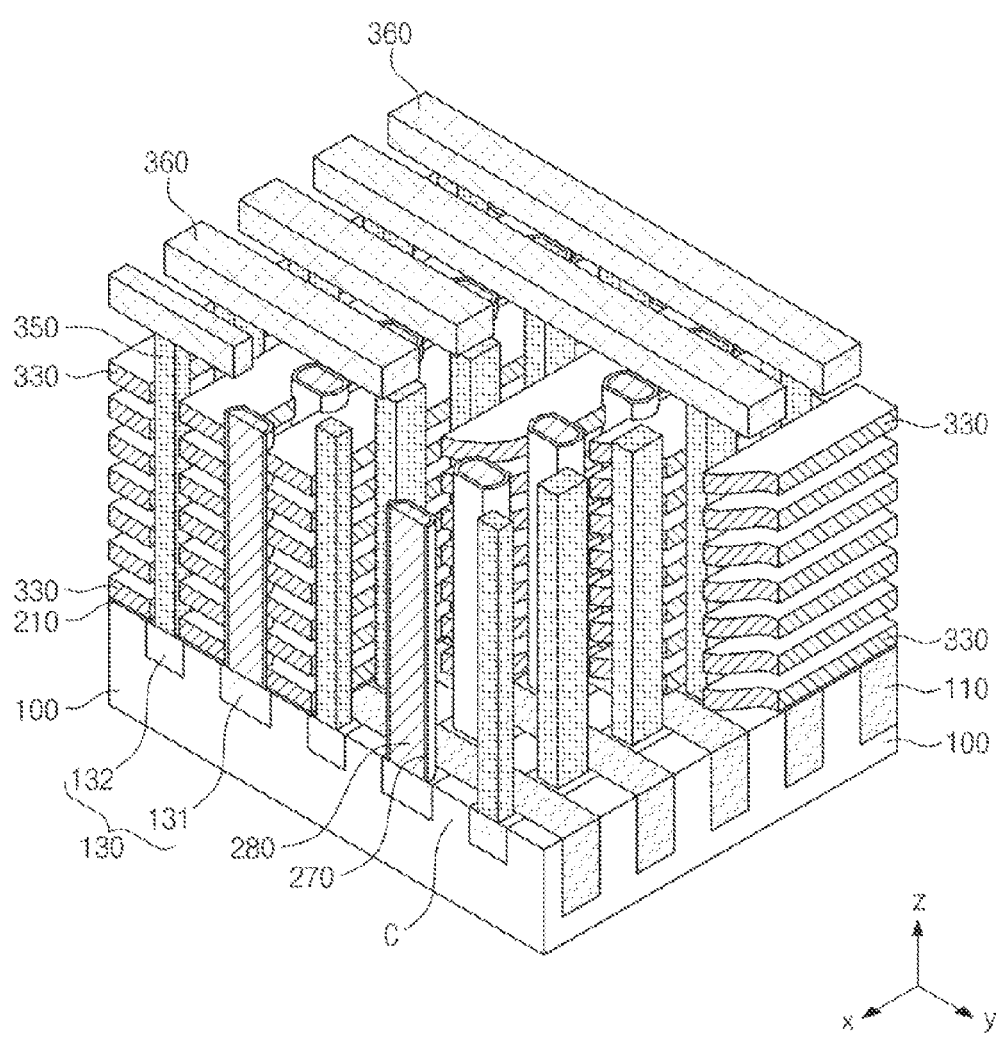
FIGS. 16 through 19 are perspective views schematically illustrating a cell array region of a 3D semiconductor device according to example embodiments of inventive concepts.
Figure 17:
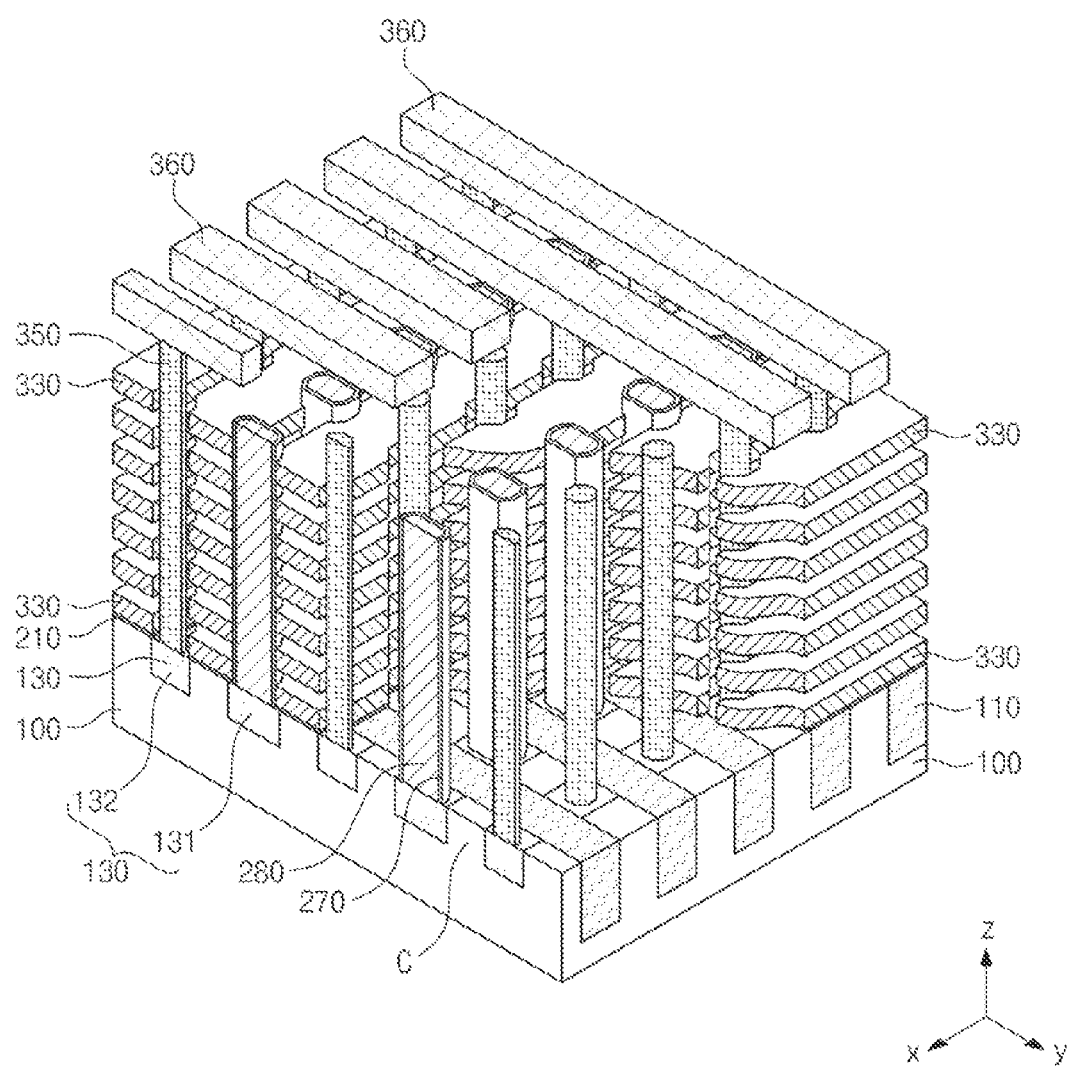

In the case of the use of the fabrication method described with reference to FIGS. 2A through 11A, each of the second plugs 350 may be formed to have a cylinder-like shape, as shown in FIG. 16. In FIG. 16, reference character C indicates the channel. By contrast, in the case of the use of the fabrication method described with reference to FIGS. 12A and 13A, each of the second plugs 350 may be formed to have a rectangular parallelepiped shape as shown in FIG. 17.

Figure 18:
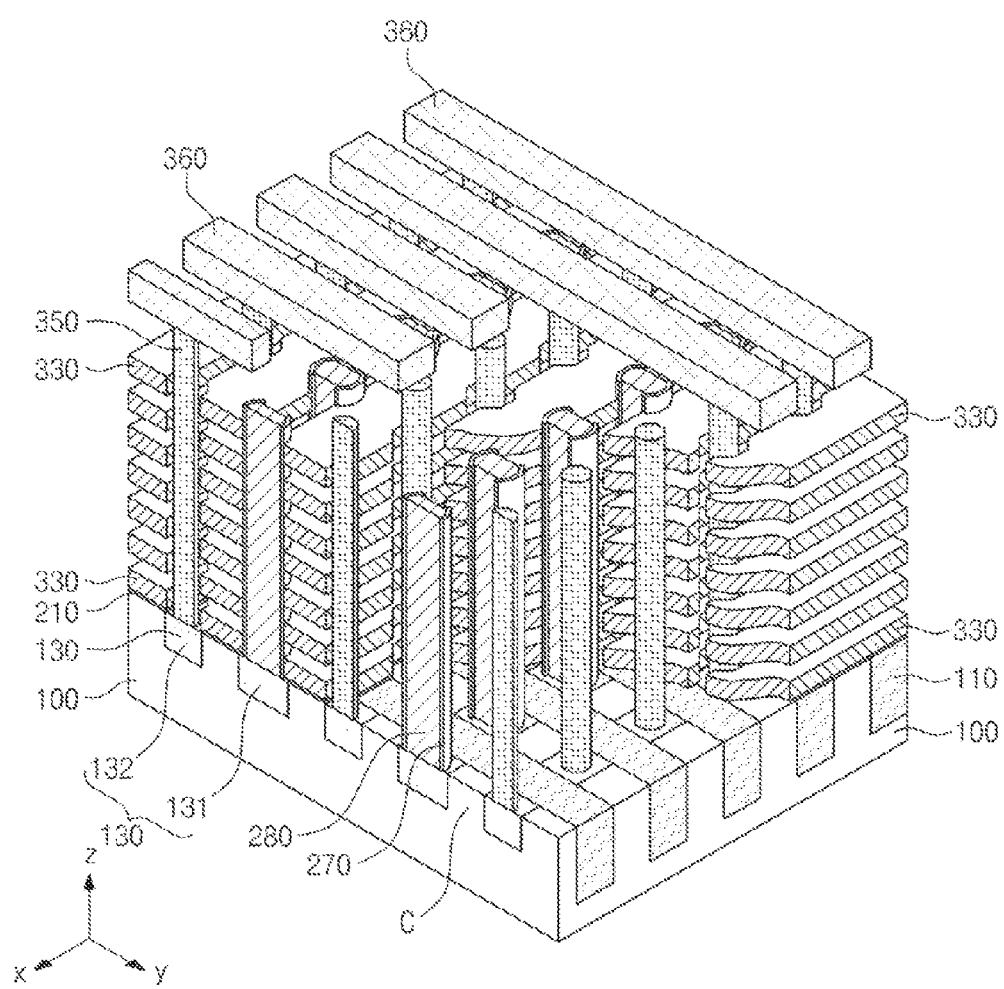

In the case of the use of the fabrication method described with reference to FIG. 14A, each of the memory patterns 270 may be formed to include two portions separated horizontally from each other, as shown in FIG. 18. For example, each of the memory patterns 270 may include a first portion covering a left-hand sidewall of the first plug 280 and a second portion spaced apart from the first portion to cover a right-hand sidewall of the first plug 280.

Figure 19:
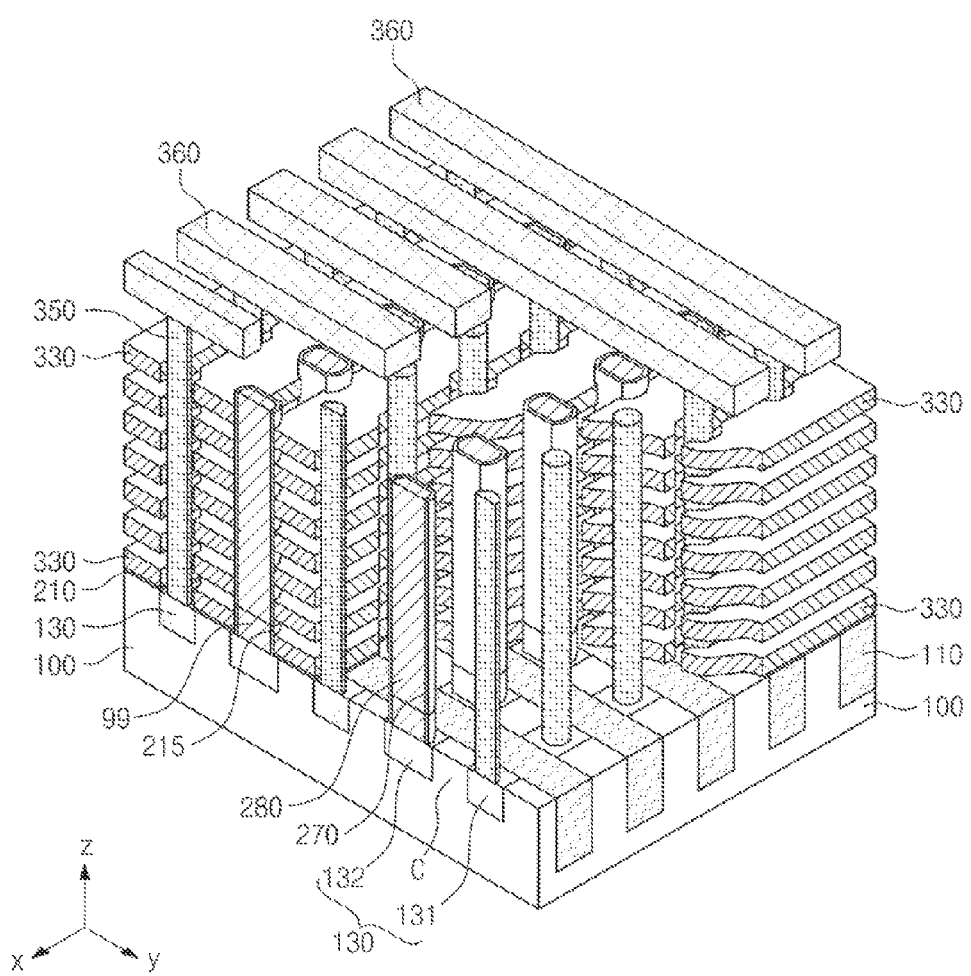

According to example embodiments of inventive concepts, as shown in FIG. 19, conductive patterns 99 may be provided below the first plugs 280, respectively, and lower insulating patterns 215 may be provided below the memory patterns 270, respectively. These features will be described in more detail with reference to FIGS. 27 and 28.

Figure 20:
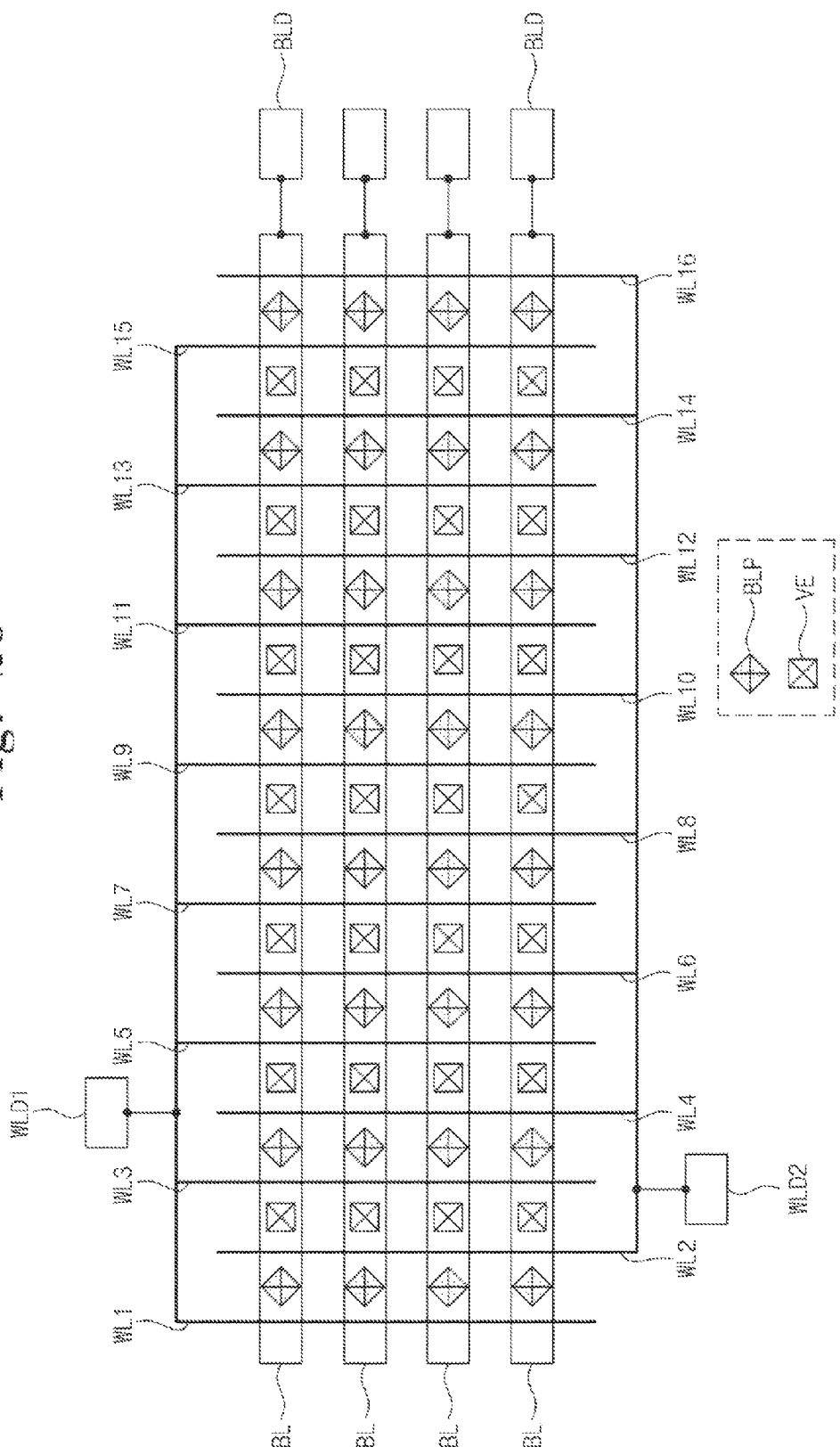
FIGS. 20 through 22 are schematic diagrams illustrating an interconnection structure of a cell array region of a 3D semiconductor device according to example embodiments of inventive concepts.
Figure 21:
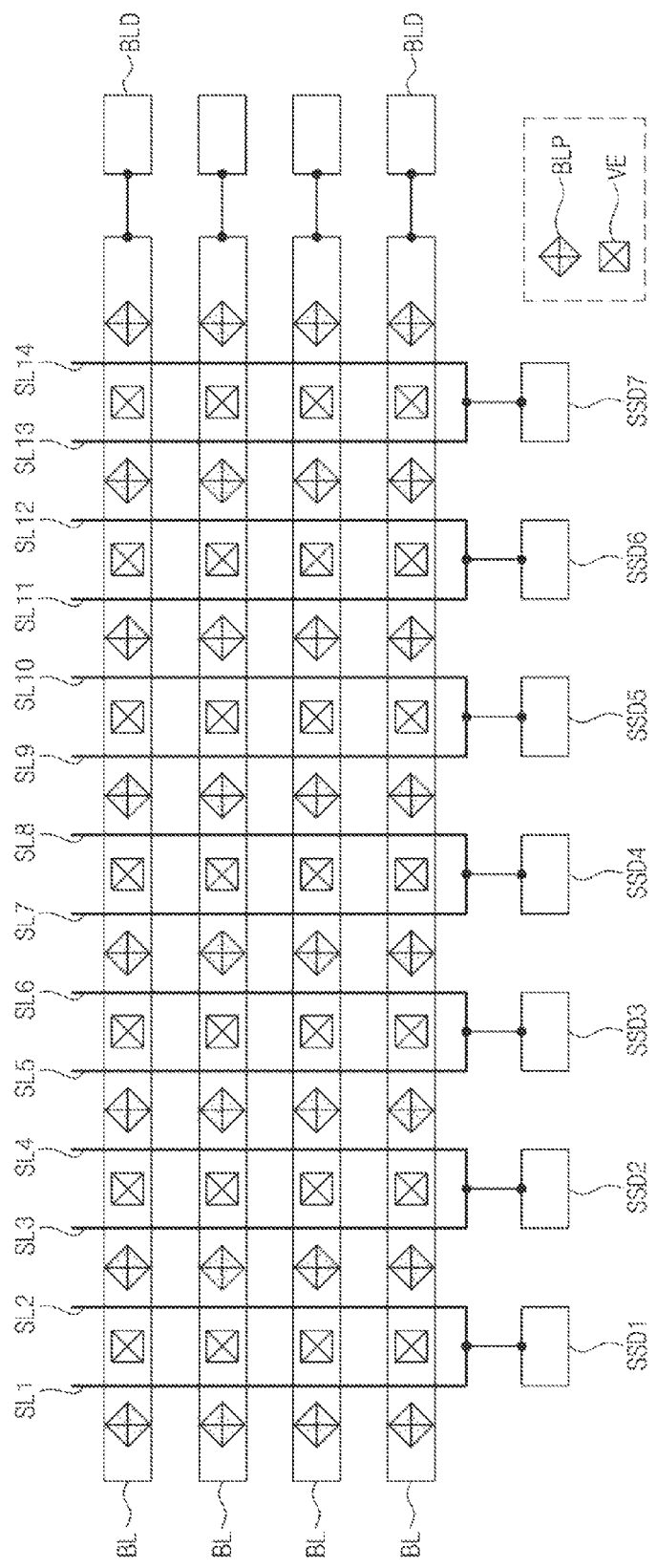
Figure 22:
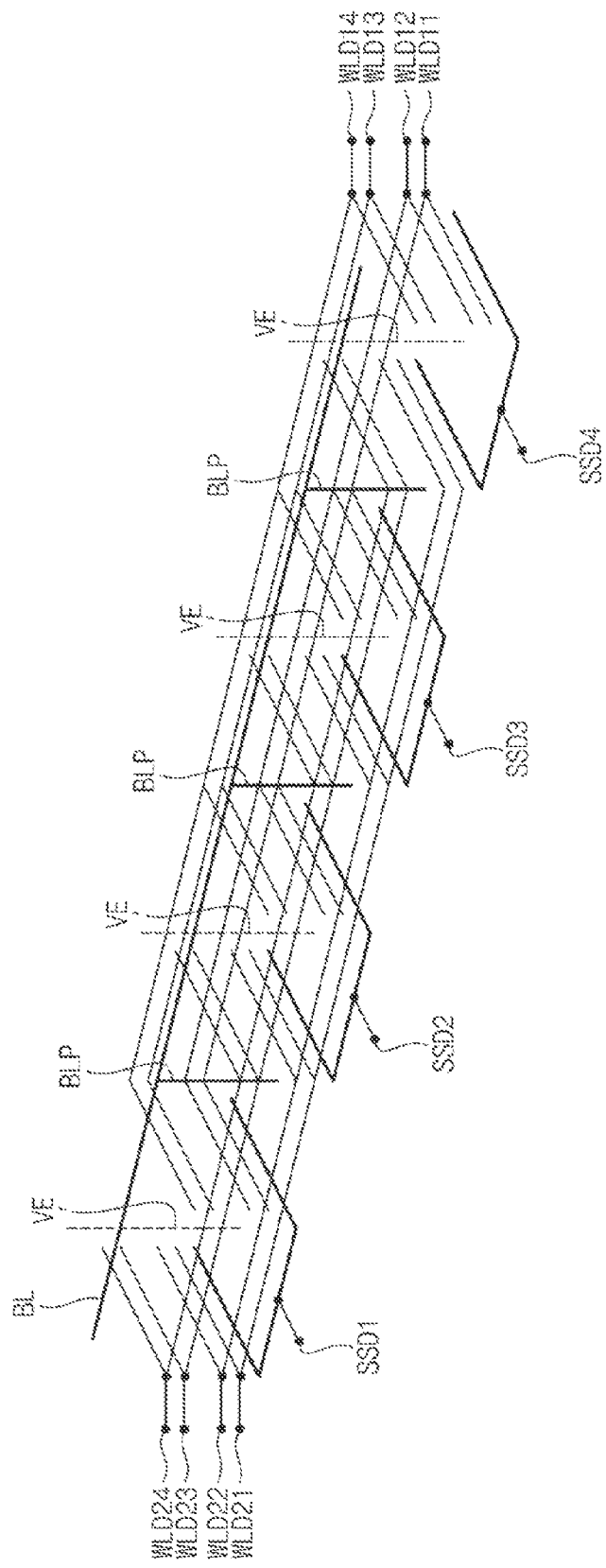

FIGS. 20 through 22 are schematic diagrams illustrating an interconnection structure of a cell array region of a 3D semiconductor device according to example embodiments of inventive concepts. In detail, FIG. 20 shows an example of a connection configuration of the word lines WL, FIG. 21 shows an example of a connection configuration of the selection lines SL, and FIG. 22 shows a three-dimensional relative disposition of interconnection lines in a cell array region exemplarily. For the sake of brevity, the elements and features of this example that are the same or similar to those previously shown and described with reference to FIGS. 1 and 15 will not be described in much further detail.

Referring to FIGS. 20 and 21, the bit line plugs BLP and the vertical electrodes VE may be alternately arranged below each of the bit lines BL. The bit lines BL may be coupled to bit line drivers BLD, respectively.

The word lines WL1-WL16 may be provided to cross the bit lines BL. Each of the word lines WL1-WL16 may be provided between a column of the bit line plugs BLP and a column of the vertical electrodes VE. Each of the word lines WL1-WL16 may be connected to either of first and second word line drivers WLD1 and WLD2. For example, odd-numbered ones of the word lines WL1-WL16 may be connected to the first word line driver WLD1, and even-numbered ones of the word lines WL1-WL16 may be connected to the second word line driver WLD2. The cell array region including the bit lines BL may be provided between the first and second word line drivers WLD1 and WLD2. In example embodiments, each of two groups consisting of the odd- or even-numbered ones of the word lines WL1-WL16 may be provided to have a finger-shaped structure, as shown in FIG. 20.

The selection lines SL1-SL14 may be provided to cross the bit lines BL. Similar to the word lines WL1-WL16, each of the selection lines SL1-SL14 may be provided between a column of the bit line plugs BLP and a column of the vertical electrodes VE. For example, the plurality of the word lines WL may be stacked on each of the selection lines SL1-SL14, as shown in FIGS. 16 through 19.

The selection lines SL1-SL14 may constitute a plurality of selection line groups, each of which may include a pair of selection lines disposed adjacent to each other. In example embodiments, each of the selection line groups may constitute two of the selection lines SL1-SL14 positioned at both sides of the vertical electrodes VE that are arranged along a direction crossing the bit lines BL. In other words, the vertical electrodes VE may be located within each of the selection line groups, while the bit line plugs BLP may be located between a pair of different selection line groups.

As shown in FIG. 21, each of the selection line groups may be connected to the corresponding one of selection line drivers SSD1-SSD7, which may be configured to be able to operate independently each other.

In the meantime, FIG. 20 shows an example of a disposition of word lines arranged at a specific level, but a 3D semiconductor device according to example embodiments of inventive concepts may include word lines, which may be disposed to have the same configuration as that shown in FIG. 20 at each level. For example, as shown in FIG. 22, word line drivers WLD11-WLD14 and WLD21-24 may be configured to be able to control independently word lines disposed at each level, and some of them the word lines (e.g., WLD11-WLD14) may be configured to control the even-numbered ones of the word lines and the others (e.g., WLD21-24) may be configured to control the odd-numbered ones of the word lines.

Figure 23:
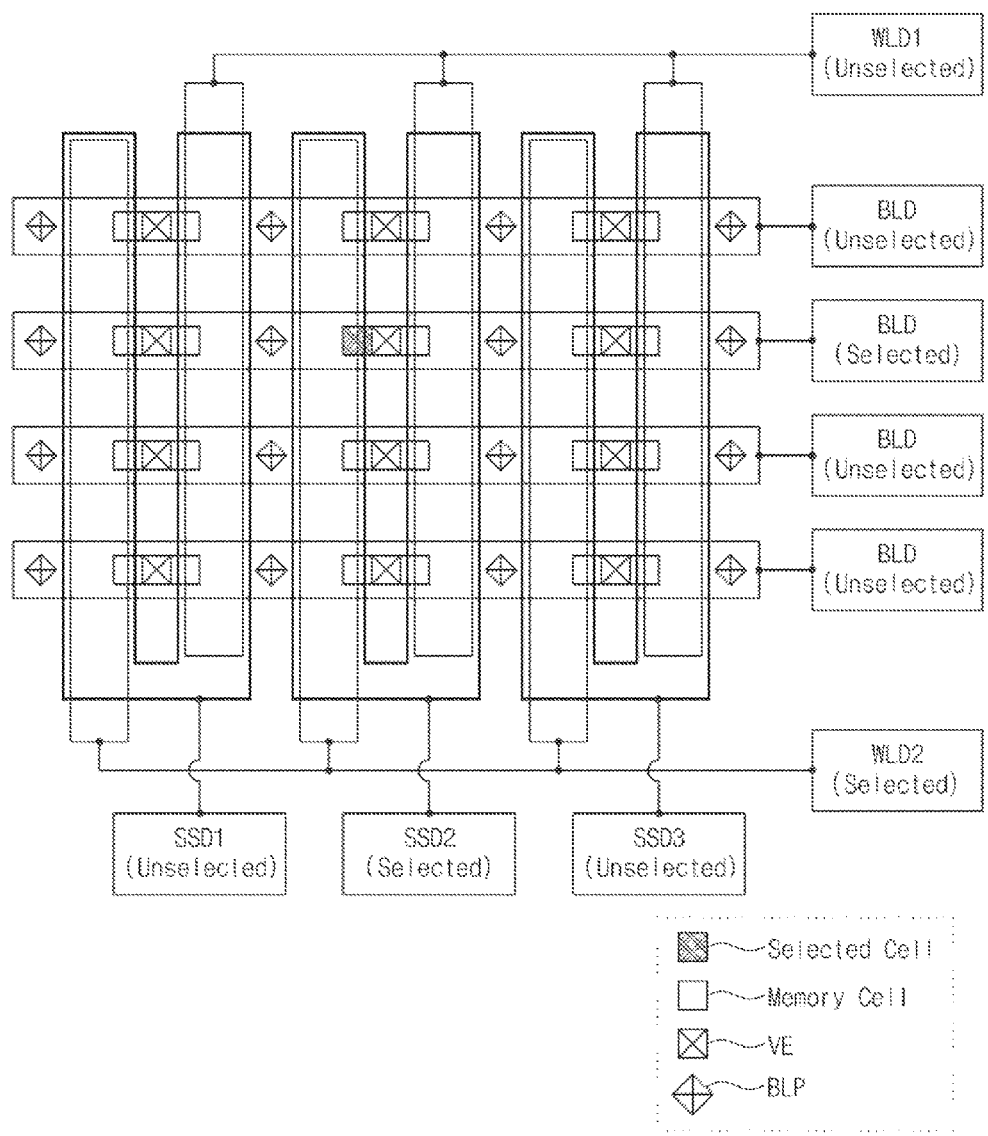
FIG. 23 is a schematic diagram illustrating a method of selecting a specific memory cell in a 3D semiconductor device according to example embodiments of inventive concepts.

FIG. 23 is a schematic diagram illustrating a method of selecting a specific memory cell in a 3D semiconductor device according to example embodiments of inventive concepts.

As shown in FIG. 23, one of the three-dimensionally arranged memory cells can be uniquely selected by selecting one of the bit line drivers BLD, one of the selection drivers SSD1-SSD3, and one of the word line drivers WLD1 and WLD2.

For example, if one of the bit line drivers BLD and one of the selection drivers SSD1-SSD3 are selected, a pair of the selection transistors SST, which are positioned at intersections of conductive lines connected thereto, can be selected. For all that, since the selected two of the selection transistors SST are configured to share one of the vertical electrodes VE, this selection enables to select a specific one of the vertical electrodes VE. In addition, as shown in FIG. 22, since a pair of the word lines WL disposed at both sides of each vertical electrode VE are electrically separated from each other, selecting one of them enables to form a unique pathway connecting one word line to one bit line via one memory cell interposed therebetween.

FIGS. 24 through 31 are sectional views of 3D semiconductor devices according to some example embodiments of inventive concepts. The afore-described 3D semiconductor devices according to example embodiments of inventive concepts may be configured to have at least one of features to be explained below.

As shown in FIGS. 16 through 19, each of the selection lines SL may have the substantially same planar shape and planar configuration as the word lines WL stacked thereon, at least in a specific region. For example, the selection line SL and the word line WL may be formed to have sidewalls vertically aligned with each other, as shown in FIGS. 24 through 26, 29 and 30. Alternatively, a lateral distance between the selection line SL and the vertical electrode VE may be substantially equivalent to that between the word line WL and the vertical electrode VE. Similarly, a lateral distance between the selection line SL and the bit line plug BLP may be substantially equivalent to that between the word line WL and the bit line plug BLP.

In example embodiments, the selection line SL may be formed of the substantially same material as the word line WL. In other example embodiments, the selection line SL and the word line WL may be formed of different materials from each other and/or may not be aligned with each other. For example, the formation of one of the horizontal electrodes 330 serving as the selection line SL may be followed by the formation of the others serving as the word line WL. In other words, an additional process for forming the selection line SL may be performed before the formation of the layered structure 200 described with reference to FIG. 4A.

Figure 28:
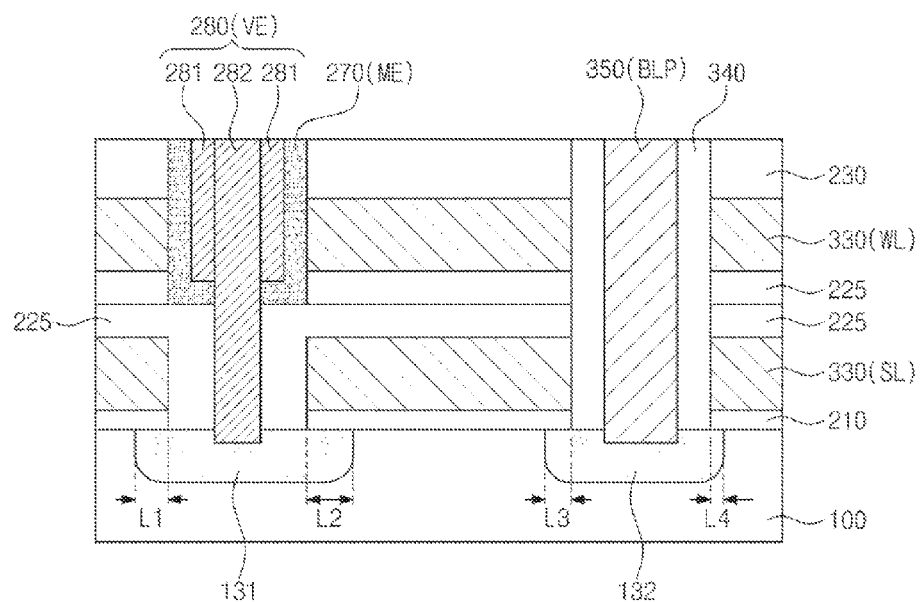

In addition, before the formation of the layered structure 200, the selection line SL may be patterned to form openings exposing the first doped region 131. In example embodiments, the openings may be filled with an interlayer dielectric 225 and a connection electrode 282 penetrating the interlayer dielectric 225, as shown in FIG. 28. Alternatively, the openings may be filled with a lower insulating spacer 215 and a conductive pattern 99.

In example embodiments, as described with reference to FIGS. 2A through 4A, the formation of the doped regions 130 may be followed by the formation of the layered structure 200, and the formation of the first and second trenches 240 and 310 may be preceded by the formation of the layered structure 200. Accordingly, the horizontal electrodes 330 may not be used as a mask to form the doped regions 130. In this sense, the relative disposition between the selection line SL and the first and second doped regions 131 and 132 may differ from the embodiments, in which the horizontal electrodes 330 are used as masks to form the first and second doped regions 131 and 132. For example, the first and second doped regions 131 and 132 may be different from each other in terms of width and area overlapping with the selection lines SL adjacent thereto. Suppose that D(L1, L2) is defined to be a difference between widths of the left- and right-hand regions of the first doped region 131, shown in FIGS. 24 through 27, overlapping with the selection lines SL adjacent thereto. In example embodiments, in this notation, at least one value of D(L1, L2), D(L1, L3), D(L1, L4), D(L2, L3), D(L2, L4) or D(L3, L4) may be different from zero.

Figure 24:
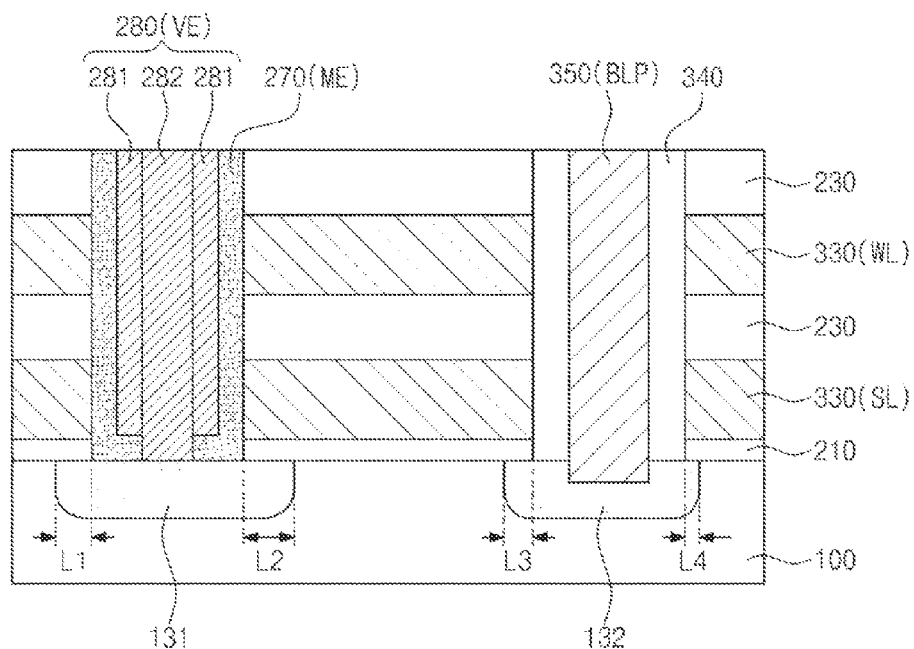
FIGS. 24 through 32 are sectional views of 3D semiconductor devices according to some example embodiments of inventive concepts.
Figure 27:
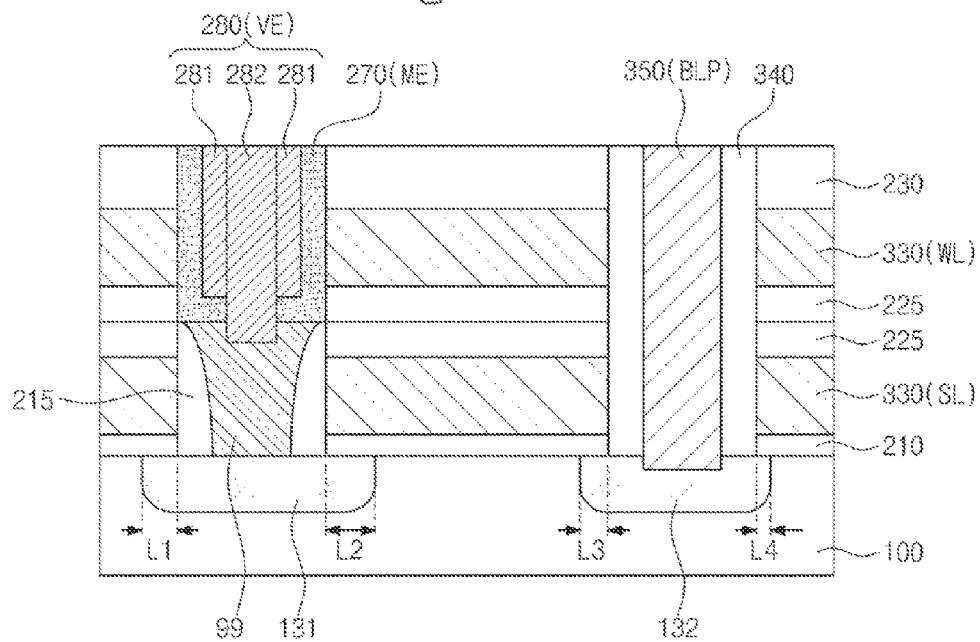
Figure 29:
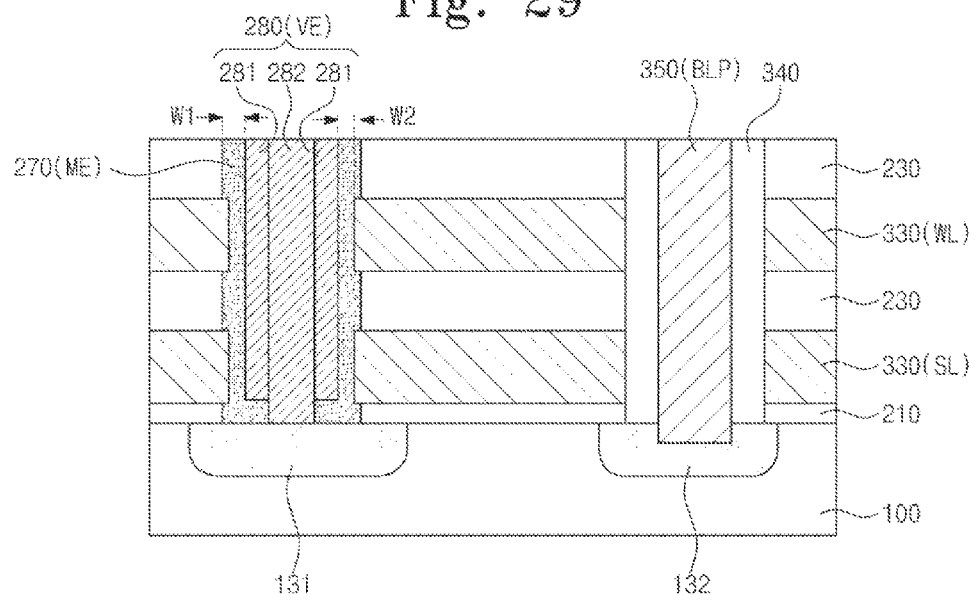
Figure 30:
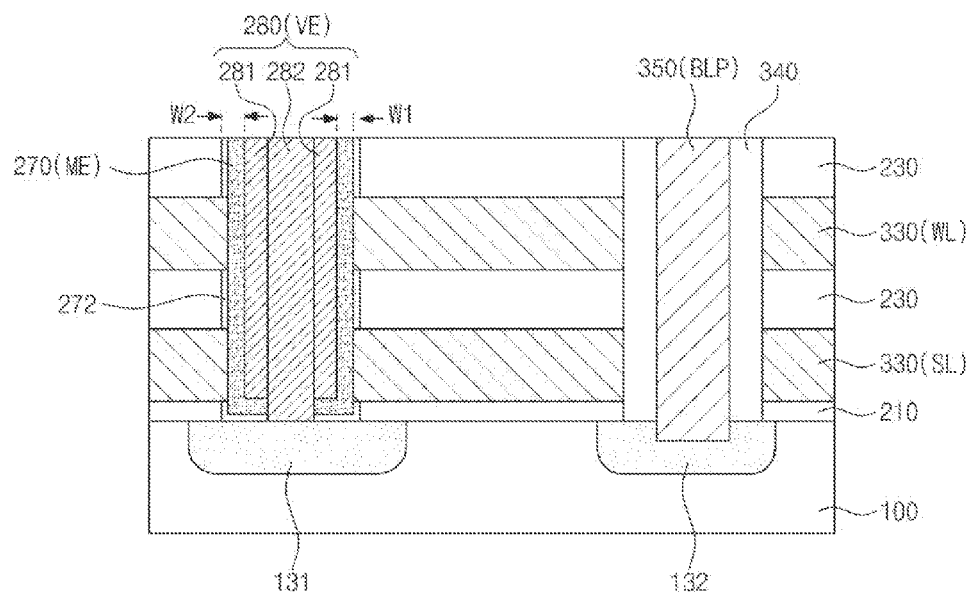

In example embodiments, the memory pattern 270 may include a sidewall portion shaped like a pipe and a bottom portion extending inward from the sidewall portion, as shown exemplarily in FIGS. 24 and 27 through 30. The vertical electrode VE may include a spacer electrode 281, which is disposed on the bottom portion of the memory pattern 270 and is shaped like a pipe, and the connection electrode 282 penetrating the spacer electrode 281. the connection electrode 282 may be connected to the first doped region 131, as shown in FIGS. 24, 29 and 30, or may be connected to the conductive pattern 99 interposed between the first doped region 131 and the memory pattern 270, as shown in FIG. 27.

Figure 25:
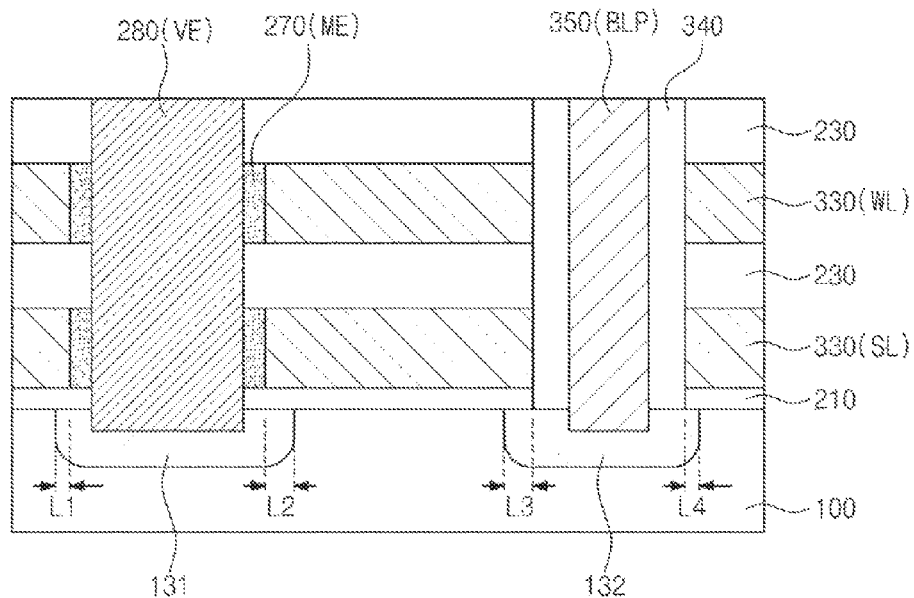

According to example embodiments of inventive concepts, as shown in FIG. 25, the memory pattern 270 may be provided in a localized space that is horizontally between the vertical electrode VE and the horizontal electrode 330 and vertically between the mold layers 230.

Figure 26:
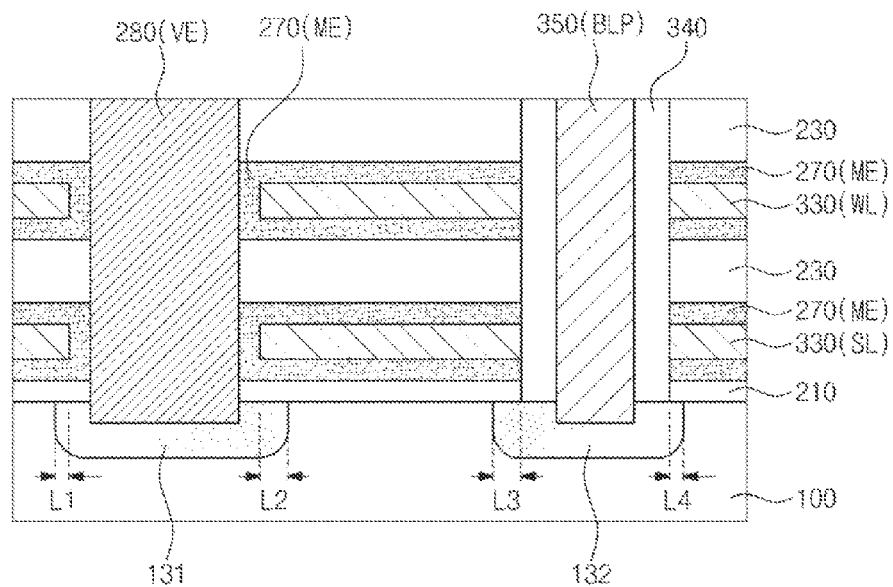

According to example embodiments of inventive concepts, as shown in FIG. 26, the memory pattern 270 may include horizontal portions covering top and bottom surfaces of the horizontal electrode 330. In addition, the memory pattern 270 may further include a vertical portion disposed between the vertical electrode VE and the horizontal electrode 330 to connect vertically the horizontal portions of the memory pattern 270. A sidewall of the horizontal electrode 330 adjacent to the bit line plug BLP may not be covered with the memory pattern 270. In the case in which the memory pattern 270 is formed to cover the recess regions 320 before the formation of the horizontal electrode 330 described with reference to FIG. 9A, the memory pattern 270 may be formed to have the structure shown in the FIG. 26.

The second plug 350 or the bit line plug BLP may be inserted to a specific depth into the substrate 100 or the second doped region 132, as shown in FIGS. 24 through 30. Although not depicted, the second gap-filling layer 340 may be also inserted to a specific depth into the substrate 100 or the second doped region 132. In example embodiments, an insertion depth of the second plug 350 may be greater than that of the second gap-filling layer 340. Similarly, the first plug 280 or the vertical electrode VE may be also inserted to a specific depth into an underlying pattern thereof (e.g., the first doped region 131 or the conductive pattern 99), as shown exemplarily in FIGS. 25 through 28.

In example embodiments, as shown in FIGS. 29 and 30, a lateral interval W1 between the mold layer 230 and the vertical electrode VE may be greater than a lateral interval W2 between the horizontal electrode 330 and the vertical electrode VE. For example, an exposed outer sidewall of the memory patterns 270 may be etched during the formation of the recess regions 320 described with reference to FIG. 8A. The structure shown in FIG. 29 may be obtained as the result of this additional etching. In some modified embodiments, a protection pattern 272 may be provided between sidewalls of the memory pattern 270 and the mold layer 230, as shown in FIG. 30. The protection pattern 272 may be a remainder of an etch stop layer, which may be provided to limit (and/or prevent) the afore-described sidewall recess of the memory pattern 270.

Figure 31:
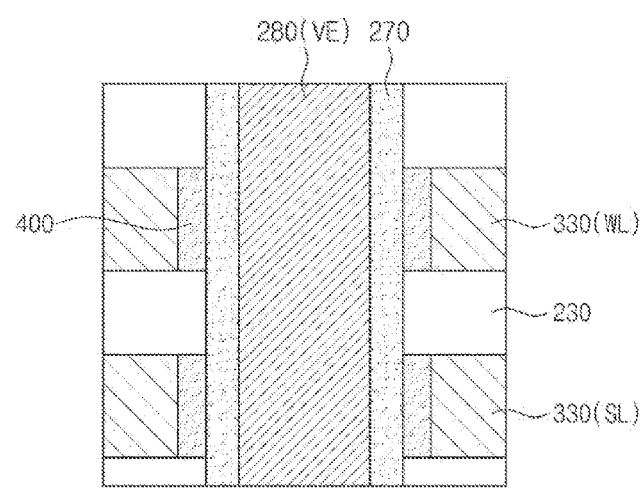

In example embodiments, as shown in FIG. 31, an additional pattern 400 may be disposed between the horizontal electrode 330 and the memory pattern 270, for example, in order to realize a rectifying device.

Figure 32:
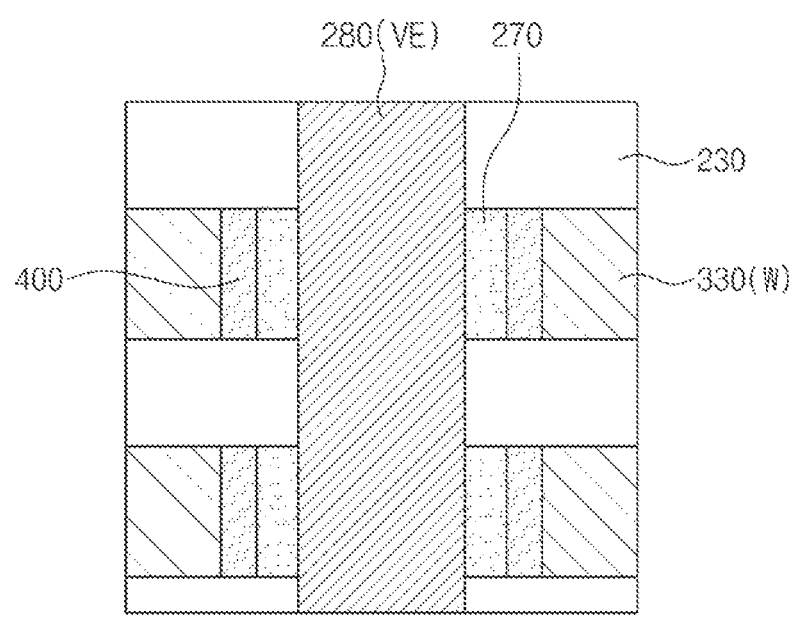

Referring to FIG. 32, the memory pattern 270 may be provided in a localized space that is horizontally between the vertical electrode VE and the additional pattern 400. The memory pattern 270 may be vertically between the mold layers 230. As a result, a space between the mold layers 230 and the vertical electrode 280 may be different from that between the additional pattern 400 and the vertical electrode 280.

[Applications of Example Embodiments]

Figure 33:
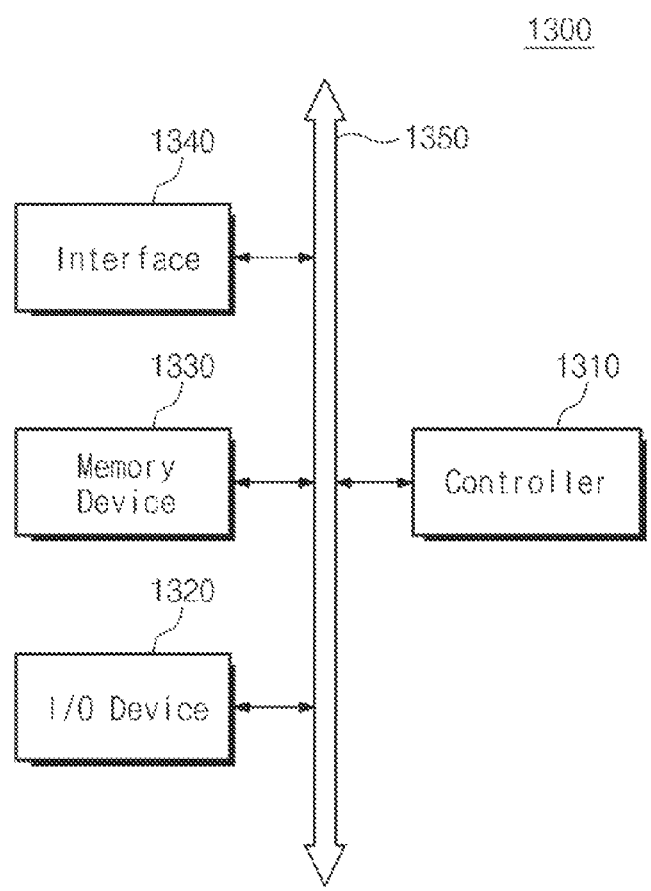
FIGS. 33 and 34 are block diagrams of electronic devices including the 3D semiconductor device according to example embodiments of inventive concepts.
Figure 34:
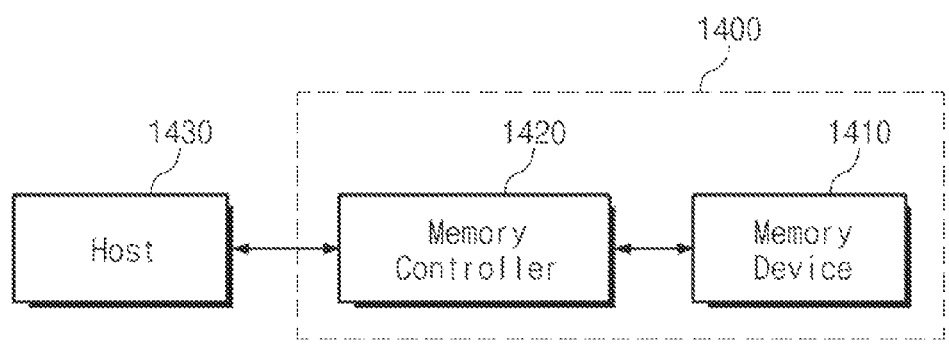

FIGS. 33 and 34 are block diagrams of electronic devices including the 3D semiconductor device according to example embodiments of inventive concepts.

Referring to FIG. 33, an electronic device 1300 including a semiconductor device according to example embodiments of inventive concepts may be used in one of a personal digital assistant (PDA), a laptop computer, a mobile computer, a web tablet, a wireless phone, a cell phone, a digital music player, a wire or wireless electronic device, or a complex electronic device including at least two ones thereof. The electronic device 1300 may include a controller 1310, an input/output device 1320 such as a keypad, a keyboard, a display, a memory 1330, and a wireless interface 1340 that are combined to each other through a bus 1350. The controller 1310 may include, for example, at least one microprocessor, a digital signal process, a microcontroller or the like. The memory 1330 may be configured to store a command code to be used by the controller 1310 or a user data. The memory 1330 may include a semiconductor device according to example embodiments of inventive concepts. The electronic device 1300 may use a wireless interface 1340 configured to transmit data to or receive data from a wireless communication network using a RF signal. The wireless interface 1340 may include, for example, an antenna, a wireless transceiver and so on. The electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Referring to FIG. 34, a memory system including a semiconductor device according to example embodiments of inventive concepts will be described. The memory system 1400 may include a memory device 1410 for storing huge amounts of data and a memory controller 1420. The memory controller 1420 controls the memory device 1410 so as to read data stored in the memory device 1410 or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device according to example embodiments of inventive concepts.

The semiconductor memory devices disclosed above may be encapsulated using various and diverse packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which a semiconductor memory device according to example embodiments of inventive concepts may be mounted may further include at least one semiconductor device (e.g., a controller and/or a logic device) that controls the semiconductor memory device.

According to example embodiments of inventive concepts, semiconductor memory devices including three-dimensionally arranged resistive memory cells are provided. The device may include switching transistors, each of which is configured to control an electric current flowing through the three-dimensionally arranged resistive memory cells. The switching transistor may be formed to have the substantially same planar shape and planar configuration as word lines stacked thereon. As a result, it is possible to increase a channel length of the switching transistor.

In addition, the word lines may be formed of a metallic material, after forming memory patterns. This enables to increase an operation speed of the semiconductor memory device.

While some example embodiments of inventive concepts have been particularly shown and described, it will be understood by one of ordinary skill in the art that variations in form and detail may be made therein without departing from the spirit and scope of the attached claims.

What is claimed is:

1. A three-dimensional semiconductor device, comprising:
    a substrate including first and second doped regions separated by a channel region;
    a bit line coupled to the first doped region;
    a vertical electrode coupled to the second doped region;
    a stack of horizontal electrodes between the substrate and the bit line,
        the stack including mold layers between the horizontal electrodes in a vertical direction,
        a space between the mold layers and the vertical electrode being greater than a space between the horizontal electrodes and the vertical electrode; and
    a selection line between the substrate and the stack of horizontal electrodes,
        the selection line has a planar shape and a planar position that is substantially the same as a planar shape and a planar position of the horizontal electrodes.

2. The device of claim 1, wherein a horizontal distance between the selection line and the vertical electrode is substantially equivalent to a horizontal distance between the horizontal electrodes and the vertical electrode.

3. The device of claim 1, further comprising:
    a bit line plug connecting the bit line with the first doped region, wherein a horizontal distance between the selection line and the bit line plug is substantially equivalent to a horizontal distance between the horizontal electrodes and the bit line plug.

4. The device of claim 1, wherein
the bit line crosses the horizontal electrodes, and
the selection line and the stack cross the channel region.

5. The device of claim 1, wherein
the selection line overlaps a first portion of the first doped region,
the selection line overlaps a first part of the second doped region, and
a width of the first portion of the first doped region is different than a width of the first part of the second doped region.

6. The device of claim 1, wherein a material of the selection line is substantially the same as a material of the horizontal electrodes.

7. The device of claim 1, further comprising:
memory patterns between the horizontal electrodes and the vertical electrode, wherein
a first horizontal thickness of the memory pattern at a level of at least one of the horizontal electrodes is smaller than a second horizontal thickness of the memory pattern at a level of the mold layer.

8. The device of claim 1, wherein the stack further comprises:
a rectifying element between the horizontal electrodes and the vertical electrode,
wherein a space between the mold layer and the vertical electrode is different from a space between the rectifying element and the vertical electrode.

9. The device of claim 1, further comprising:
memory patterns between the horizontal electrodes and the vertical electrode,
wherein the memory patterns contain at least one of chalcogenides, layered structures configured to exhibit a magnetoresistance property, perovskite compounds, and transition metal oxides.

10. A three-dimensional semiconductor device, comprising:
a selection line group including first and second selection lines connected to each other;
a plurality of word lines sequentially stacked on each of the first and second selection lines,
the plurality of word lines each having a shape that is identical to a shape of at least one of the first and second selection lines;
vertical electrodes arranged in a row between the first and second selection lines;
mold layers between the word lines in a vertical direction, a space between the mold layers and the vertical electrodes being greater than a space between at least one of the plurality of word lines and the vertical electrodes;
a plurality of bit line plugs arranged in a row at each of both sides of the selection line group; and
bit lines crossing the word lines and connecting the bit line plugs with each other.

11. The device of claim 10, wherein the word lines are electrically separated from each other and are thereby configured to have different voltages from each other.

12. The device of claim 10, wherein
the word lines delimit a first trench,
the vertical electrodes are in the first trench,
the word lines delimit second trenches,
the bit line plugs are in the second trench, and
each of the second trenches has a length that is sufficient to cross a plurality of the bit lines.

13. The device of claim 12, wherein the first trench has a length that is sufficient to cross a plurality of the bit lines.

14. The device of claim 10, wherein each of the first and second selection lines has a planar shape and a planar position that is substantially the same as a planar shape and a planar position of the plurality of word lines on the first and second selection lines.

15. The device of claim 10, wherein horizontal distances between the first and second selection lines and the vertical electrode are substantially equivalent to horizontal distances between the plurality of word lines and the vertical electrode.

16. The device of claim 10, wherein horizontal distances between the first and second selection lines and the bit line plugs are substantially equivalent to horizontal distances between the word lines and the bit line plugs.

17. The device of claim 10, further comprising:
a plurality of active patterns below the selection line group, wherein each of the active patterns includes,
a pair of drain regions spaced apart from each other,
a source region between the drain regions, and
a pair of channel regions between the drain regions and the source region, and
the vertical electrodes are coupled to the source regions,
the bit line plugs are coupled to the drain regions, and
the first and second selection lines face the pair of channel regions.

18. The device of claim 17, wherein
a width of each one of the drain regions overlaps with one of the first and second selection lines, and
the width of each one of the drain regions that overlaps with one of the first and second selection lines is different from at least one of a first width of the source region that overlaps with the first selection line and a second width of the source region that overlaps with the second selection line.

19. The device of claim 10, wherein a material of the first and second selection lines is substantially the same as a material of the plurality of word lines.

20. The device of claim 10, further comprising:
memory patterns between the word lines and the vertical electrode, wherein
a first horizontal thickness of the memory pattern at a level of at least one of the plurality of word lines is smaller than a second horizontal thickness of the memory pattern at a level of at least one of the mold layers.

21. The device of claim 10, further comprising:
memory patterns between the word lines and the vertical electrode, wherein the memory patterns contain at least one of chalcogenides, layered structures configured to exhibit a magnetoresistance property, perovskite compounds, and transition metal oxides.

22. The device of claim 1, further comprising:
memory patterns including parts horizontally between the horizontal electrodes and the vertical electrode,
the memory patterns including other parts horizontally between the selection line and the vertical electrode.

23. The device of claim 10, further comprising:
memory patterns including parts horizontally between the plurality of word lines and the vertical electrodes,
the memory patterns including other parts horizontally between the vertical electrodes and the first and second selection lines.

* * * * *